US008022406B2

(12) United States Patent
Honda

(10) Patent No.: US 8,022,406 B2
(45) Date of Patent: Sep. 20, 2011

(54) LIGHT EMITTING DEVICE

(75) Inventor: Tatsuya Honda, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 12/358,843

(22) Filed: Jan. 23, 2009

(65) Prior Publication Data

US 2009/0189161 A1 Jul. 30, 2009

(30) Foreign Application Priority Data

Jan. 29, 2008 (JP) ................................ 2008-017188

(51) Int. Cl.
*H01L 31/0232* (2006.01)

(52) U.S. Cl. ................ 257/59; 257/72; 257/83; 257/84; 257/88; 257/E33.052; 257/E33.053; 257/E33.055

(58) Field of Classification Search ........................ None
See application file for complete search history.

(56) References Cited

U.S. PATENT DOCUMENTS 6,583,775 B1 6/2003 Sekiya et al.
6,730,966 B2 5/2004 Koyama
6,825,820 B2 11/2004 Yamazaki et al.
6,982,462 B2 1/2006 Koyama
7,113,154 B1 9/2006 Inukai
2003/0111966 A1 6/2003 Mikami et al.
2003/0142509 A1 7/2003 Tsuchiya et al.
2003/0218166 A1 11/2003 Tsutsui
2005/0093802 A1 5/2005 Yamazaki et al.
2006/0033161 A1 2/2006 Koyama
2006/0043380 A1 3/2006 Hiroshi et al.
2006/0103290 A1 * 5/2006 Suh et al. ..................... 313/463
2006/0208962 A1 9/2006 Sekiya (Continued)

FOREIGN PATENT DOCUMENTS

EP 1 061 497 A1 12/2000

(Continued)

OTHER PUBLICATIONS

Inukai, K. et al, “36.4L: Late-News Paper: 4.0-in. TFT-OLED Displays and a Novel Digital Driving Method,” SID Digest ’00, SID International Symposium Digest of Technical Papers, vol. 31, 2000, pp. 924-927.

(Continued)

*Primary Examiner* — Minh-Loan T Tran
*Assistant Examiner* — Fei Fei Yeung Lopez
(74) *Attorney, Agent, or Firm* — Husch Blackwell LLP

(57) ABSTRACT

While suppressing the frequency of a signal line driver circuit, a blur of a moving image of a light-emitting device using a light-emitting transistor can be prevented, without reducing a frame frequency. A switching element is provided in a path of a current which flows between a source and a drain of a light-emitting transistor, and the light-emitting transistor is made not to emit light by turning off the switching element, whereby pseudo-impulse driving is performed. Switching of the switching element can be controlled by a scan line driver circuit. In a specific structural example, the light-emitting device includes, in a pixel, a light-emitting transistor, a first switching element which controls supply of a potential of a video signal to a gate of the light-emitting transistor, and a second switching element which controls a current which flows between a source and a drain of the light-emitting transistor.

6 Claims, 17 Drawing Sheets

U.S. PATENT DOCUMENTS

| | | | |
|---|---|---|---|
| 2009/0135105 | A1 | 5/2009 | Nakamura et al. |
| 2009/0179195 | A1 | 7/2009 | Obata et al. |

FOREIGN PATENT DOCUMENTS

| | | | |
|---|---|---|---|
| EP | 1 103 946 | A2 | 5/2001 |
| EP | 1 478 031 | A1 | 11/2004 |
| JP | 2001-343933 | | 12/2001 |
| JP | 2002-151276 | | 5/2002 |
| JP | 2006-252774 | | 9/2006 |
| JP | 2006-252775 | | 9/2006 |
| JP | 2006-253162 | | 9/2006 |
| JP | 2006-253163 | | 9/2006 |
| JP | 2006-253164 | | 9/2006 |
| WO | WO 03/071608 | A1 | 8/2003 |
| WO | WO 2007/043697 | A1 | 4/2007 |
| WO | WO 2007/063992 | A1 | 6/2007 |

OTHER PUBLICATIONS

European Search report re application No. EP 09000812.9, dated Mar. 16, 2010.

* cited by examiner

FIG. 9A writing period
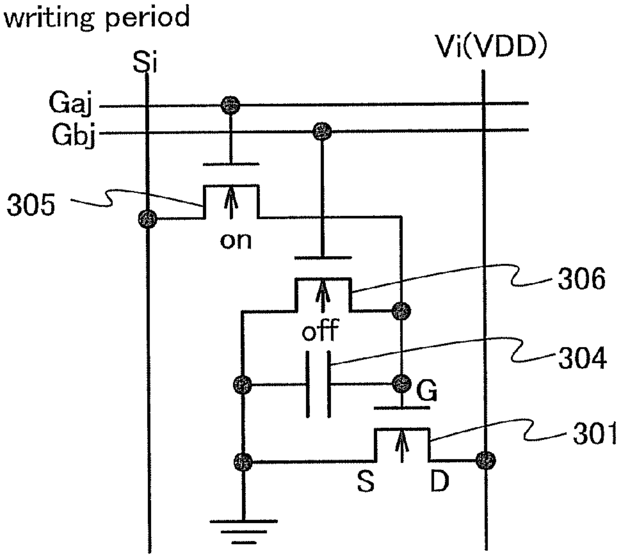
FIG. 9B display period
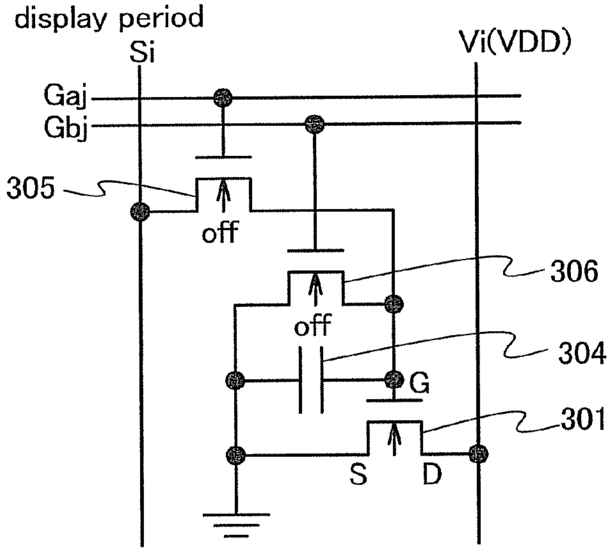
FIG. 9C erasing period
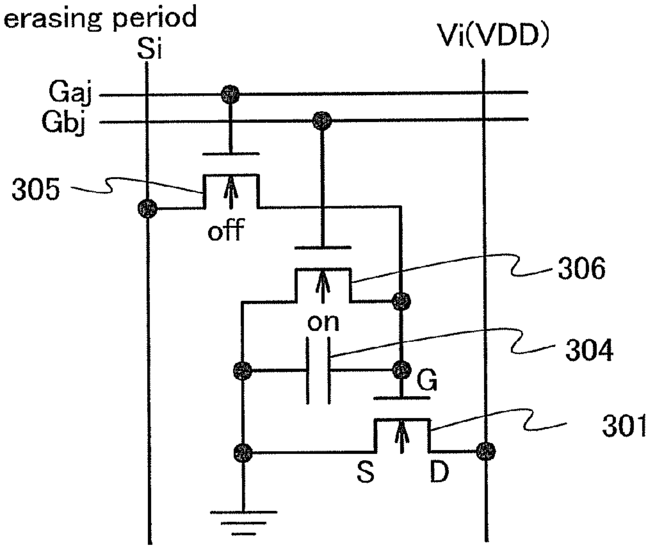

LIGHT EMITTING DEVICE

BACKGROUND OF THE INVENTION

1. Field of the Invention

The present invention relates to a light-emitting device using a light-emitting transistor.

2. Description of the Related Art

Since light-emitting devices using light-emitting elements as display elements have high visibility, are suitable for reduction in thickness, and have a wide viewing angle, they have attracted attention as display devices which can take the place of cathode ray tubes (CRTs) or liquid crystal display devices. In particular, a light-emitting element having a transistor structure, which is called a light-emitting transistor, has both a function of a light-emitting element and a function of a transistor. Therefore, a light-emitting device including a light-emitting transistor in a pixel has a higher aperture ratio than a light-emitting device including both a light-emitting element and a transistor which controls a current supplied to the light-emitting element in a pixel. In addition, compared to the case of manufacturing both a transistor and a light-emitting element, fewer elements are needed to be formed in a light-emitting device using a light-emitting transistor; therefore, a light-emitting device using a light-emitting transistor is advantageous also in the yield and manufacturing cost of products.

Reference 1 (PCT International Publication No. 03/071608) and Reference 2 (Japanese Published Patent Application No. 2006-252774) each discloses a specific structure of a light-emitting transistor.

SUMMARY OF THE INVENTION

In a liquid crystal element, in general, response time that the transmittance of liquid crystal molecules takes to complete its change after a change in applied voltage is long, e.g., several milliseconds to several tens of milliseconds. Thus, in a liquid crystal display device using a liquid crystal element, delay in change of luminance with respect to the change in applied voltage in a pixel tends to be recognized as a blur of a moving image. On the other hand, in the light-emitting element including a light-emitting transistor as described above, response time that the luminance takes to complete its change after a change in applied voltage is short, e.g., several microseconds. Thus, in a light-emitting device using a light-emitting element as a display element, a blur of a moving image is not easily recognized, compared to a liquid crystal display device using a liquid crystal element.

In addition, a liquid crystal display device is driven by hold-type driving in which luminance is kept until a video signal is input to a pixel again. This is another reason why a blur of a moving image is recognized with a liquid crystal display device, in addition to the long response time. Since human eyes tend to recognize afterimages, with hold-type driving in which any gray levels except black are successively displayed, human eyes cannot follow changes in the gray levels, whereby a moving image is likely to be seen as a blur. Also in a light-emitting device using a light-emitting element such as an organic EL element as a display element, hold-type driving is usually used as in the case of a liquid crystal display device. Therefore, in a light-emitting device using a light-emitting element as a display element, as long as usual hold-type driving is performed, the short response time cannot be exploited, and a problem of a blur of a moving image is not easily solved.

In order to prevent a blur of a moving image due to hold-type driving, pseudo-impulse driving for displaying black images, which achieves a similar effect to impulse-driving used in cathode ray tubes (CRTs), has been attracting attention. By using pseudo-impulse driving, human eyes do not often recognize afterimages; thus, the problem of a blur of a moving image can be solved. In a liquid crystal display device, by making a backlight blink or inputting a video signal having information of a black image to a pixel, pseudo-impulse driving can be achieved. On the other hand, in order to achieve pseudo-impulse driving in a light-emitting device using a light-emitting element as a display element, in which a backlight as in a liquid crystal display device is not used, a method in which a backlight is made to blink cannot be employed and a method in which a video signal having information of a black image is input to a pixel may be employed.

However, in the case where pseudo-impulse driving is performed by inputting a video signal having information of a black image to a pixel, the driving frequency of a signal line driver circuit which controls input of a video signal to a pixel needs to be increased.

While pixels in each line are selected by a scan line driver circuit, a signal line driver circuit needs to input video signals to all the pixels in the line. Thus, the driving frequency of a signal line driver circuit is much higher than that of a scan line driver circuit. Further, since the number of pixels has been increased in active matrix light-emitting devices in recent years in order to display an image with higher definition and higher resolution, also in the case of not performing pseudo-impulse driving, the driving frequency of a signal line driver circuit tends to be increased. Therefore, when a video signal having information of a black image is input to a pixel for pseudo-impulse driving, a load on a signal line driver circuit is further increased, and a problem such as an increase in power consumption arises. Note that, with a frame frequency reduced, a video signal having information of a black image can be input to a pixel while the frequency of a signal line driver circuit is suppressed, but a flicker is easily generated, which is not preferable.

In view of the foregoing problems, it is an object of the present invention to prevent, while suppressing the frequency of a signal line driver circuit, a blur of a moving image in a light-emitting device using a light-emitting transistor, without reducing a frame frequency.

According to an aspect of the present invention, a switching element is provided in a path of a current which flows between a source and a drain of a light-emitting transistor, and the light-emitting transistor is made not to emit light by turning off the switching element. Switching of the switching element can be controlled by a scan line driver circuit.

According to another aspect of the present invention, a switching element is provided to control connection between a gate and a source of a light-emitting transistor, and the light-emitting transistor is made not to emit light by turning on the switching element. Switching of the switching element can be controlled by a scan line driver circuit.

In a structural example, specifically, a light-emitting device includes a light-emitting transistor, a first switching element which controls supply of a potential of a video signal to a gate of the light-emitting transistor, and a second switching element which controls a current flowing between a source and a drain of the light-emitting transistor.

In another structural example, specifically, a light-emitting device includes a light-emitting transistor, a first switching element which controls supply of a potential of a video signal to a gate of the light-emitting transistor, and a second switching element which controls connection between the gate and a source of the light-emitting transistor.

By using any of the above structures, even when a video signal having information of a black image is not input to a pixel, a light-emitting transistor can be made to be turned off, that is, the light-emitting transistor can be made not to emit light by a scan line driver circuit. Therefore, while suppressing the frequency of a signal line driver circuit, pseudo-impulse driving for displaying black images can be performed without reducing a frame frequency. Therefore, a blur of a moving image can be prevented.

BRIEF DESCRIPTION OF THE DRAWINGS

FIGS. 9A to 9C each illustrate an example of an operation of a pixel included in a light-emitting device, which is applicable to the present invention.

DETAILED DESCRIPTION OF THE INVENTION

Embodiment modes and embodiments of the present invention disclosed herein will be described below with reference to the accompanying drawings. The present invention disclosed herein can be implemented in various modes, and it is easily understood by those skilled in the art that modes and details thereof can be modified in various ways without departing from the spirit and the scope of the present invention. Therefore, the present invention should not be construed as being limited to the following description of the embodiment modes and the embodiments.

Note that a light-emitting device includes, in its category, a panel in which a light-emitting transistor is sealed, and a module in which an IC or the like including a controller is mounted on the panel. Moreover, the light-emitting device also includes an element substrate which is in a mode before completion of a light-emitting transistor in a manufacturing process of a panel or a module. The element substrate includes a means for supplying a current to a light-emitting transistor in each of a plurality of pixels. Specifically, the element substrate may be in a state in which a semiconductor element other than a light-emitting transistor is formed and a light-emitting device having a pixel configuration of the present invention is formed when the light-emitting transistor is formed in a later step.

Embodiment Mode 1

Figure 1A:
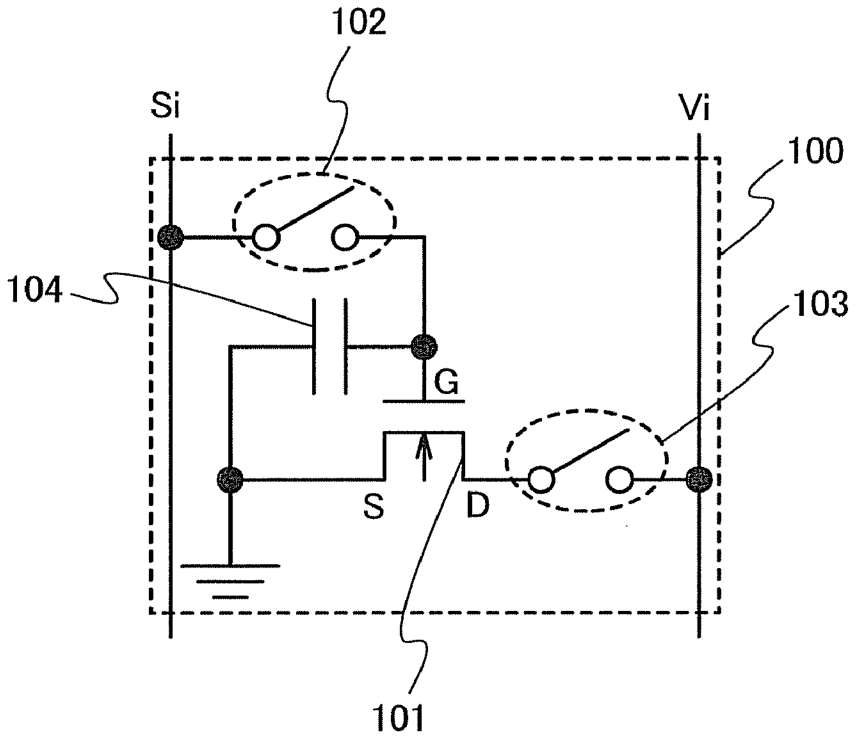
FIGS. 1A and 1B each illustrate an example of a configuration of a pixel included in a light-emitting device, which is applicable to the present invention.
Figure 1B:
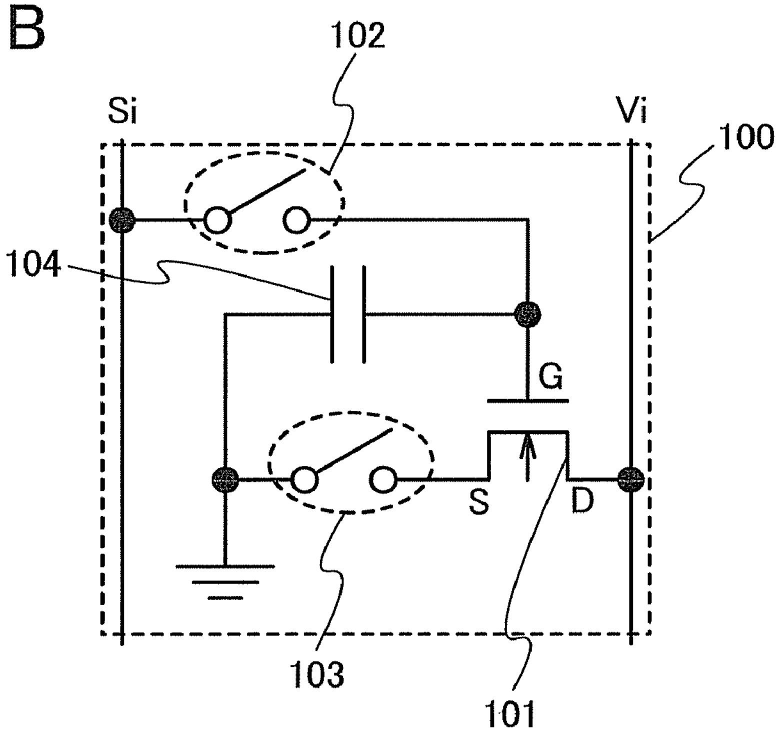

Examples of a configuration of a pixel included in a light-emitting device according to the present invention will be described with reference to FIGS. 1A and 1B. FIGS. 1A and 1B illustrate examples of a circuit diagram of a pixel included in a light-emitting device of this embodiment mode.

A pixel 100 illustrated in FIG. 1A includes at least a light-emitting transistor 101, a first switching element 102, and a second switching element 103. A potential of a video signal is applied to a signal line Si (i=1 to x). The first switching element 102 controls supply of the potential of the video signal to a gate (G) of the light-emitting transistor 101.

In addition, in the pixel 100 illustrated in FIG. 1A, the light-emitting transistor 101 is an n-channel transistor. A common potential (COM) is applied to a source (S) of the light-emitting transistor 101, and a potential (VDD) at a higher level than the common potential is applied to a power supply line Vi (i=1 to x). The second switching element 103 is provided between a drain (D) of the light-emitting transistor 101 and the power supply line Vi. Therefore, the second switching element 103 electrically controls connection between the drain of the light-emitting transistor 101 and the power supply line Vi, whereby a current which flows between the source and the drain of the light-emitting transistor 101 can be controlled. Note that the connection means a state in which a plurality of objects have electrical continuity therebetween, i.e., are electrically connected to each other.

Further, in the pixel 100 illustrated in FIG. 1A, a storage capacitor 104 is provided to hold a potential of the gate of the light-emitting transistor 101. Specifically, the gate of the light-emitting transistor 101 is connected to one of a pair of electrodes of the storage capacitor 104, and the common potential is applied to the other of the pair of electrodes. The storage capacitor 104 in FIG. 1A is not limited to the above configuration. The storage capacitor 104 may have any configuration as long as the potential of the gate of the light-emitting transistor 101 can be held. Therefore, for example, the gate (G) of the light-emitting transistor 101 may be connected to one of the pair of electrodes of the storage capacitor 104 and a constant potential other than the common potential may be applied to the other of the pair of electrodes of the storage capacitor 104. Note that the storage capacitor 104 is not necessarily provided in the case where gate capacitance between the gate and a semiconductor film of the light-emitting transistor 101 is large enough.

Note that in the pixel 100 illustrated in FIG. 1A, the second switching element 103 is provided between the drain of the light-emitting transistor 101 and the power supply line Vi, but the present invention is not limited to this configuration. FIG. 1B illustrates another example of the circuit diagram of the pixel 100, in the case where the common potential is applied to the source of the light-emitting transistor 101 via the second switching element 103. In the pixel 100 illustrated in FIG. 1B, a potential of the power supply line Vi is applied to the drain of the light-emitting transistor 101. The second switching element 103 electrically controls connection between an electrode or a wiring having the common potential and the source of the light-emitting transistor 101, whereby a current which flows between the source and the drain of the light-emitting transistor 101 can be controlled.

Although the potential (VDD) at a higher level than the common potential is applied to the power supply line Vi in the pixel 100 illustrated in FIGS. 1A and 1B, a potential (VSS) at a lower level than the common potential may also be applied to the power supply line Vi. In such a case, the source and the drain of the light-emitting transistor 101 are switched.

Figure 2A:
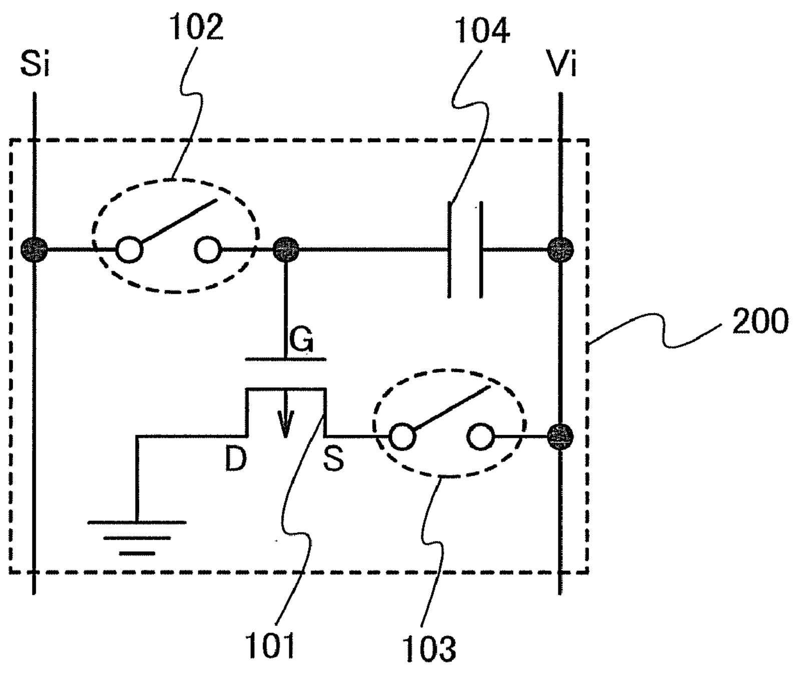
FIGS. 2A and 2B each illustrate an example of a configuration of a pixel included in a light-emitting device, which is applicable to the present invention.

In addition, although the light-emitting transistor 101 is an n-channel transistor in the pixel configurations in FIGS. 1A and 1B, the light-emitting transistor 101 may be a p-channel transistor. FIG. 2A illustrates an example of a circuit diagram of a pixel in the case where the light-emitting transistor 101 is a p-channel transistor.

A pixel 200 illustrated in FIG. 2A includes at least a light-emitting transistor 101, a first switching element 102, and a second switching element 103, similarly to the pixel 100 illustrated in FIG. 1A. A potential of a video signal is applied to a signal line Si (i=1 to x). The first switching element 102 can control supply of the potential of the video signal to a gate (G) of the light-emitting transistor 101.

Further, in the pixel 200 illustrated in FIG. 2A, the light-emitting transistor 101 is a p-channel transistor. A common potential (COM) is applied to a drain (D) of the light-emitting transistor 101, and a potential (VDD) at a higher level than the common potential is applied to a power supply line Vi (i=1 to x). The second switching element 103 is provided between a source (S) of the light-emitting transistor 101 and the power supply line Vi. Therefore, the second switching element 103 electrically controls connection between the source of the light-emitting transistor 101 and the power supply line Vi, whereby a current which flows between the source and the drain of the light-emitting transistor 101 can be controlled.

In addition, in the pixel 200 illustrated in FIG. 2A, one of a pair of electrodes of a storage capacitor 104 is connected to a gate (G) of the light-emitting transistor 101, and the other of the pair of electrodes of the storage capacitor 104 is connected to the power supply line Vi. The storage capacitor 104 in FIG. 2A is not limited to the above configuration. The storage capacitor 104 may have any configuration as long as the potential of the gate of the light-emitting transistor 101 can be held. Therefore, for example, the gate (G) of the light-emitting transistor 101 may be connected to one of the pair of electrodes of the storage capacitor 104 and a constant potential such as the common potential may be applied to the other of the pair of electrodes of the storage capacitor 104. Note that the storage capacitor 104 is not necessarily provided in the case where gate capacitance between the gate and a semiconductor film of the light-emitting transistor 101 is large enough, similarly to the pixel 100 illustrated in FIGS. 1A and 1B.

Figure 2B:
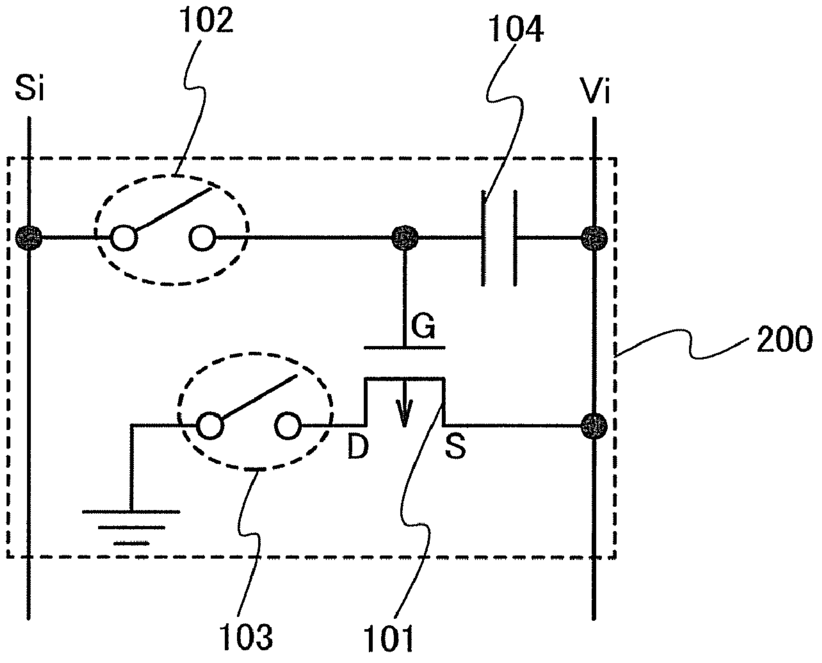

Note that in the pixel 200 illustrated in FIG. 2A, the second switching element 103 is provided between the source of the light-emitting transistor 101 and the power supply line Vi, but the present invention is not limited to this configuration. FIG. 2B illustrates an example of the circuit diagram of the pixel 200 in the case where the common potential is applied to the drain of the light-emitting transistor 101 via the second switching element 103. In the pixel 200 illustrated in FIG. 2B, a potential of the power supply line Vi is applied to the source of the light-emitting transistor 101. The second switching element 103 electrically controls connection between an electrode or a wiring having the common potential and the drain of the light-emitting transistor 101, whereby a current which flows between the source and the drain of the light-emitting transistor 101 can be controlled.

Although the potential (VDD) at a higher level than the common potential is applied to the power supply line Vi in the pixel 200 illustrated in FIGS. 2A and 2B, a potential (VSS) at a lower level than the common potential may also be applied to the power supply line Vi. In such a case, the source and the drain of the light-emitting transistor 101 are switched.

Note that in FIGS. 1A and 1B and FIGS. 2A and 2B, transistors can be used as the first switching element 102 and the second switching element 103. In addition, as the first and second switching elements 102 and 103, a logic circuit which can control electrical continuity and electrical discontinuity between two terminals, such as a transmission gate using a transistor, can be used.

Figure 3:
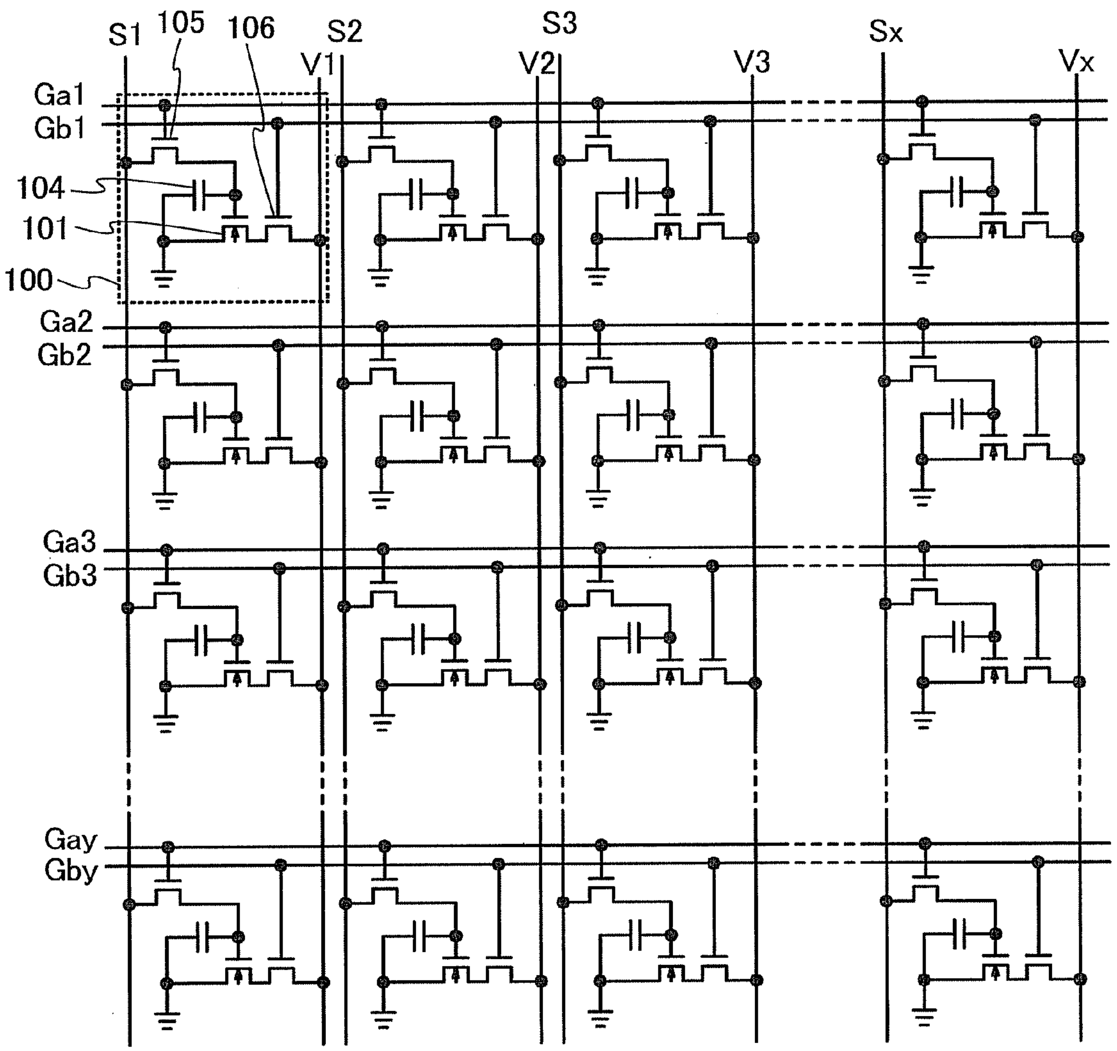
FIG. 3 illustrates an example of a configuration of a pixel portion included in a light-emitting device, which is applicable to the present invention.

FIG. 3 illustrates an example of a circuit diagram of an entire pixel portion in the case where an n-channel transistor 105 and an n-channel transistor 106 are used for the first switching element 102 and the second switching element 103, respectively, in the pixel 100 illustrated in FIG. 1A.

The pixel portion illustrated in FIG. 3 is provided with signal lines S1 to Sx, power supply lines V1 to Vx, first scan lines Ga1 to Gay, and second scan lines Gb1 to Gby. At least one of the signal lines S1 to Sx, one of the power supply lines V1 to Vx, one of the first scan lines Ga1 to Gay, and one of the second scan lines Gb1 to Gby are connected to each pixel 100.

In the pixel portion illustrated in FIG. 3, a gate of the transistor 105 included in each pixel 100 is connected to one of the first scan lines Ga1 to Gay. In addition, one of a source and a drain of the transistor 105 is connected to one of the signal lines S1 to Sx, and the other of the source and the drain is connected to a gate of a light-emitting transistor 101. A gate of the transistor 106 included in each pixel 100 is connected to one of the second scan lines Gb1 to Gby. In addition, one of a source and a drain of the transistor 106 is connected to one of the power supply lines V1 to Vx, and the other of the source and the drain of the transistor 106 is connected to one of a source and a drain of the light-emitting transistor 101.

Figure 4:
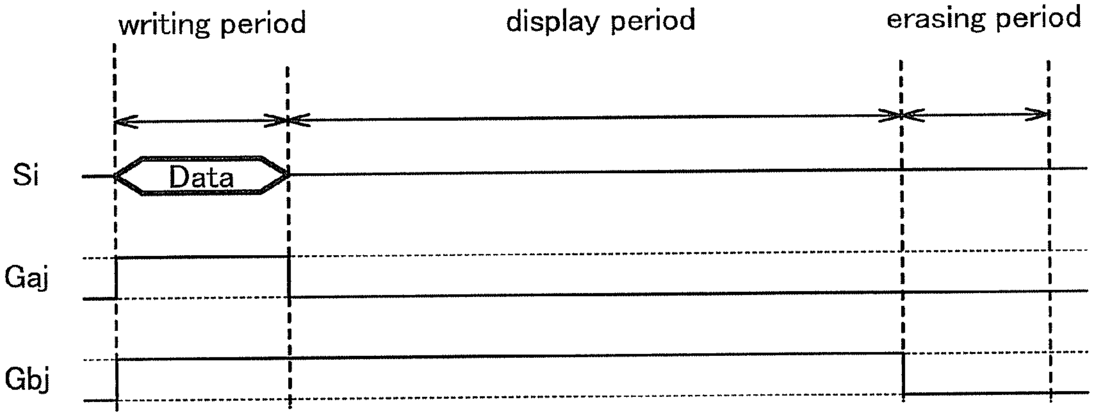
FIG. 4 illustrates an example of a timing chart of a potential which is applied to a pixel included in a light-emitting device, which is applicable to the present invention.
Figure 5A:
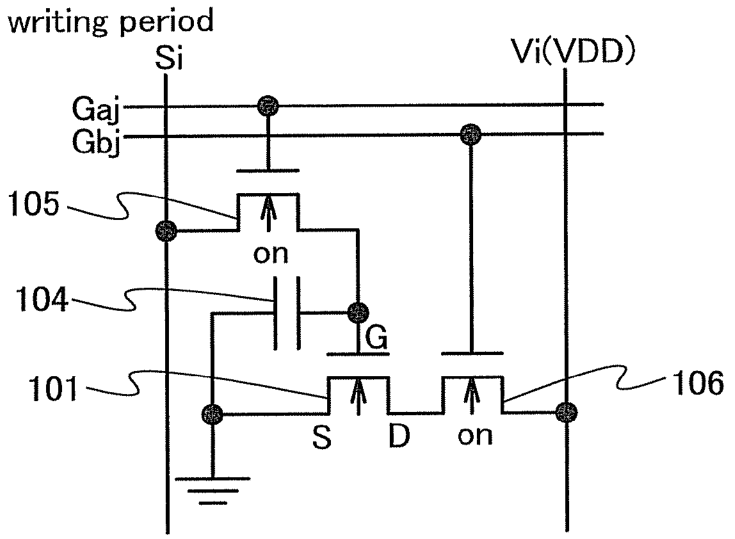
FIGS. 5A to 5C each illustrate an example of an operation of a pixel included in a light-emitting device, which is applicable to the present invention.
Figure 5B:
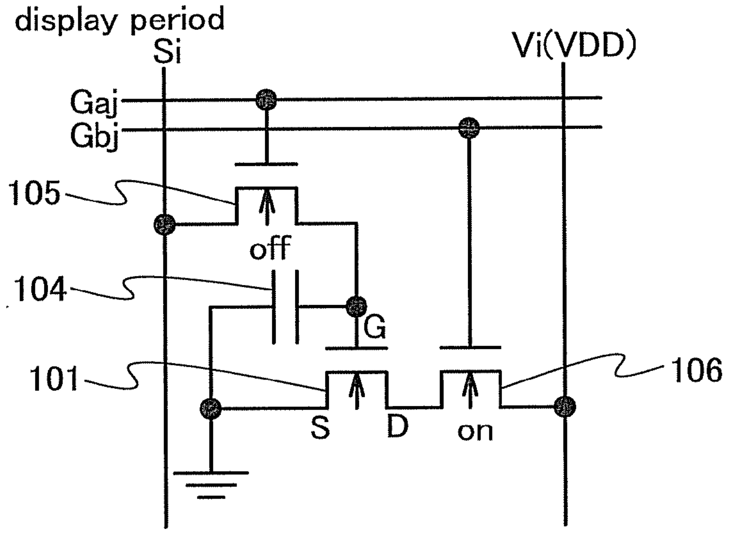
Figure 5C:
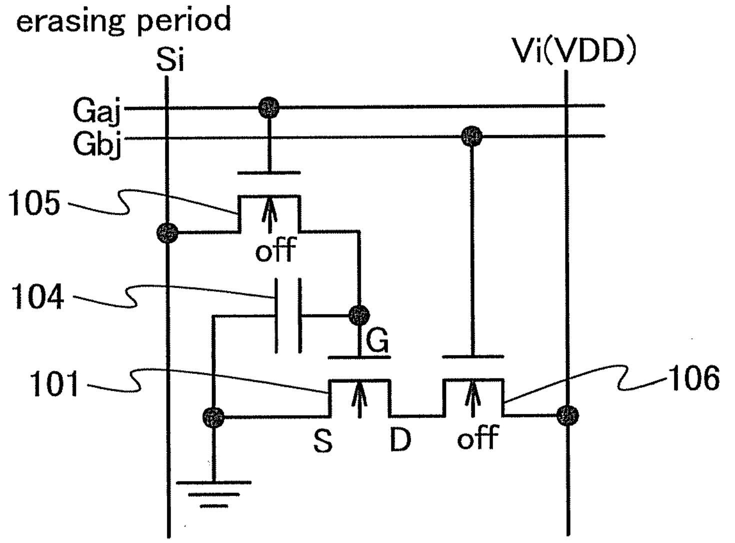

Next, an operation of the pixel portion illustrated in FIG. 3 will be described. The operation of the pixel portion can be described for each of a writing period, a display period, and an erasing period. FIG. 4 is a timing chart of potentials which are applied to the signal line Si (i=1 to x), the first scan line Gaj (j=1 to y), and the second scan line Gbj (j=1 to y). Further, FIGS. 5A to 5C illustrate the operation of a pixel in the above periods. FIGS. 5A to 5C illustrate the case where a high-level potential VDD is applied to the power supply line Vi.

First, in the writing period, the first switching element 102 and the second switching element 103 are turned on. Specifically, in the pixel 100 included in the pixel portion illustrated in FIG. 3, as illustrated in FIG. 4, a high-level potential is applied to the first scan line Gaj, a high-level potential is applied to the second scan line Gbj, and a potential (DATA) of a video signal for the pixel 100 is applied to the signal line Si. Therefore, as illustrated in FIG. 5A, the transistor 105 is turned on, and the potential of the video signal is applied to the gate of the light-emitting transistor 101 via the transistor 105. In addition, since the transistor 106 is turned on, the drain of the light-emitting transistor 101 and the power supply line Vi are connected.

If the level of the potential (DATA) of the video signal is high, a potential difference is generated between the gate and the source of the light-emitting transistor 101. With the potential difference greater than or equal to the threshold voltage of the light-emitting transistor 101, a current flows between the source and the drain of the light-emitting transistor 101, so that the light-emitting transistor 101 emits light. On the other hand, if the level of the potential (DATA) of the video signal is low and the potential difference between the gate and the source of the light-emitting transistor 101 is lower than the threshold voltage of the light-emitting transistor 101, a current scarcely flows between the source and the drain, so that the light-emitting transistor 101 does not emit light.

A potential between the gate and the source of the light-emitting transistor 101 can be held by a storage capacitor 104.

Next, in the display period, the first switching element 102 is turned off and the second switching element 103 is turned on. Specifically, in the pixel 100 included in the pixel portion illustrated in FIG. 3, as illustrated in FIG. 4, a low-level potential is applied to the first scan line Gaj, and a high-level potential is applied to the second scan line Gbj. To the signal line Si, a potential (DATA) of a video signal for a pixel 100, which is different from the pixel 100 to which the potential of the video signal is applied in the immediately preceding writing period, is applied. However, since the first switching element 102 is turned off, the potential of the above video signal is not applied to the gate of the light-emitting transistor 101 of this pixel 100.

Accordingly, as illustrated in FIG. 5B, the transistor 105 is turned off, and the potential of the gate of the light-emitting transistor 101 is held. In addition, because the transistor 106 is kept in an on-state, the drain of the light-emitting transistor 101 and the power supply line Vi are electrically connected. Thus, if the light-emitting transistor 101 emits light in the immediately preceding writing period, the light-emitting transistor 101 emits light continuously also in the display period. On the contrary, if the light-emitting transistor 101 does not emit light in the immediately preceding writing period, the light-emitting transistor 101 does not emit light in the display period, either.

Next, in the erasing period, the first switching element 102 and the second switching element 103 are turned off. Specifically, in the pixel 100 included in the pixel portion illustrated in FIG. 3, as illustrated in FIG. 4, a low-level potential is applied to the first scan line Gaj, and a low-level potential is applied to the second scan line Gbj. Therefore, as illustrated in FIG. 5C, the transistor 105 is kept in an off-state. Further, since the transistor 106 is turned off, the drain of the light-emitting transistor 101 and the power supply line Vi are not electrically connected, that is, do not have electrical continuity therebetween.

Therefore, even if the light-emitting transistor 101 emits light in the immediately preceding display period, a path of the current is blocked by the transistor 106; thus, the light-emitting transistor 101 is made not to emit light.

The second switching element 103 is turned off in the erasing period to make the light-emitting transistor 101 not emit light, whereby a black image is inserted. Switching of the second switching element 103 does not depend on image information of a video signal but can be controlled by a potential applied to the second scan line Gbj. Therefore, pseudo-impulse driving can be achieved without inputting a video signal having information of a black image to the pixel. Accordingly, while suppressing the frequency of a signal line driver circuit which supplies a video signal to the signal line, a blur of a moving image can be prevented without reducing a frame frequency. Further, by suppressing the frequency of the signal line driver circuit, the reliability of the signal line driver circuit can be ensured, and power consumption of the entire light-emitting device can be suppressed.

Embodiment Mode 2

Figure 6A:
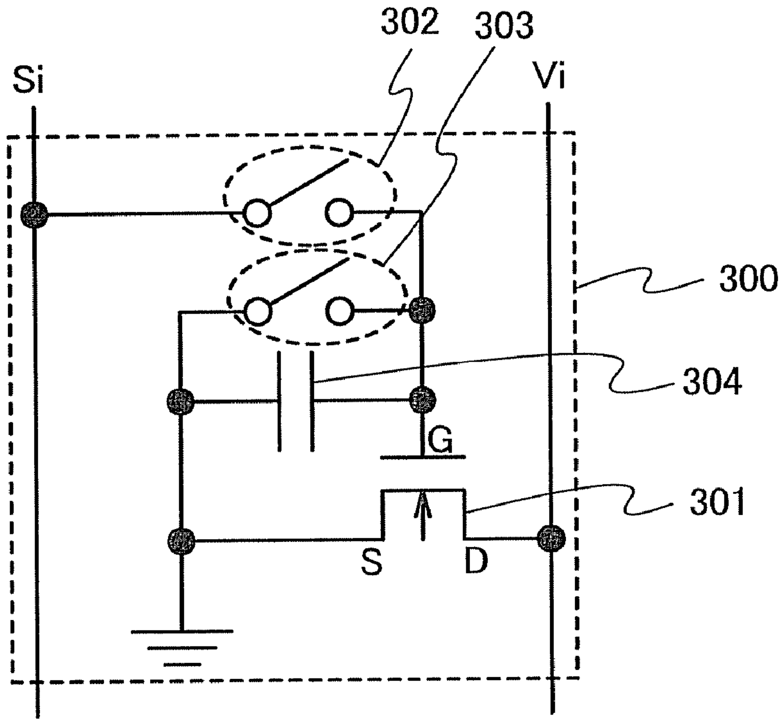
FIGS. 6A and 6B each illustrate an example of a configuration of a pixel included in a light-emitting device, which is applicable to the present invention.
Figure 6B:
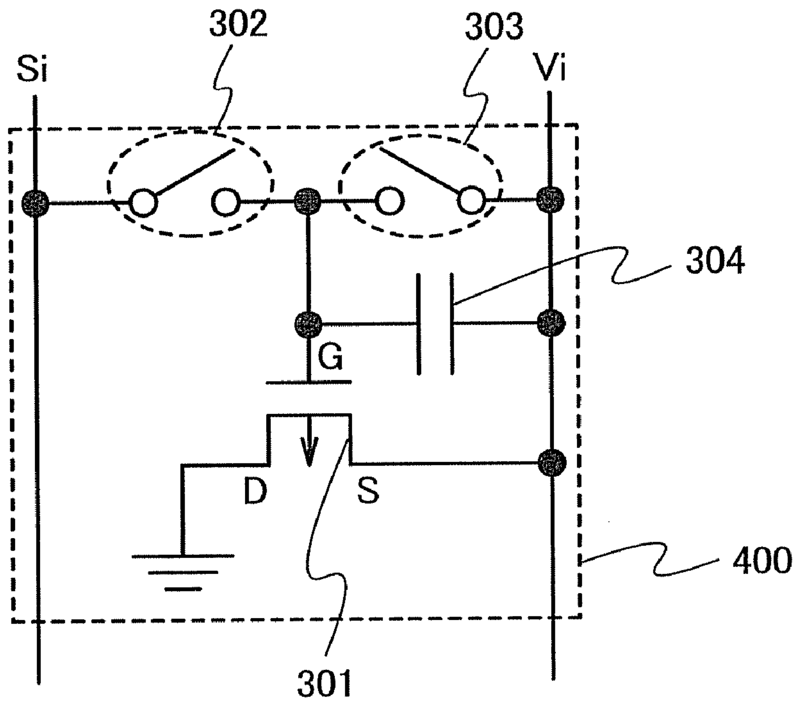

Examples of a configuration of a pixel included in a light-emitting device according to the present invention, which are different from those in Embodiment Mode 1, will be described with reference to FIGS. 6A and 6B. FIGS. 6A and 6B illustrate examples of a circuit diagram of a pixel included in a light-emitting device of this embodiment mode.

A pixel 300 illustrated in FIG. 6A includes at least a light-emitting transistor 301, a first switching element 302, and a second switching element 303. A potential of a video signal is applied to a signal line Si (i=1 to x). The first switching element 302 can control supply of the potential of the video signal to a gate (G) of the light-emitting transistor 301.

In addition, in the pixel 300 illustrated in FIG. 6A, the light-emitting transistor 301 is an n-channel transistor. A common potential (COM) is applied to a source (S) of the light-emitting transistor 301, and a potential (VDD) at a higher level than the common potential is applied to a power supply line Vi (i=1 to x). The potential (VDD) of the power supply line Vi is applied to a drain (D) of the light-emitting transistor 301. The second switching element 303 is provided between the gate and the source of the light-emitting transistor 301. Therefore, the second switching element 303 electrically controls connection between the gate and the source of the light-emitting transistor 301, whereby a potential difference (a gate voltage) between the gate and the source of the light-emitting transistor 301 can be controlled.

Further, in the pixel 300 illustrated in FIG. 6A, a storage capacitor 304 is provided to hold a potential of the gate of the light-emitting transistor 301. Specifically, the gate of the light-emitting transistor 301 is connected to one of a pair of electrodes of the storage capacitor 304, and the common potential is applied to the other of the pair of electrodes of the storage capacitor 304. The storage capacitor 304 in FIG. 6A is not limited to the above configuration. The storage capacitor 304 may have any configuration as long as the potential of the gate of the light-emitting transistor 301 can be held. Therefore, for example, the gate (G) of the light-emitting transistor 301 may be connected to one of the pair of electrodes of the storage capacitor 304 and a constant potential other than the common potential may be applied to the other of the pair of electrodes of the storage capacitor 304. Note that the storage capacitor 304 is not necessarily provided in the case where gate capacitance between the gate and a semiconductor from of the light-emitting transistor 301 is large enough.

In the pixel 300 illustrated in FIG. 6A, the potential (VDD) at a higher level than the common potential is applied to the power supply line Vi, but a potential (VSS) at a lower level than the common potential may also be applied to the power supply line Vi. In such a case, the source and the drain of the light-emitting transistor 301 are switched.

In addition, although the light-emitting transistor 301 is an n-channel transistor in the pixel configuration in FIG. 6A, the light-emitting transistor 301 may be a p-channel transistor. FIG. 6B illustrates an example of a circuit diagram of a pixel in the case where the light-emitting transistor 301 is a p-channel transistor.

A pixel 400 illustrated in FIG. 6B includes at least a light-emitting transistor 301, a first switching element 302, and a second switching element 303, similarly to the pixel 300 illustrated in FIG. 6A. A potential of a video signal is applied to a signal line Si (i=1 to x). The first switching element 302 controls supply of the potential of the video signal to a gate (G) of the light-emitting transistor 301.

In the pixel 400 illustrated in FIG. 6B, the light-emitting transistor 301 is a p-channel transistor. A common potential (COM) is applied to a drain (D) of the light-emitting transistor 301, and a potential (VDD) at a higher level than the common potential is applied to a power supply line Vi (i=1 to x). The potential (VDD) of the power supply line Vi is applied to a source (S) of the light-emitting transistor 301. The second switching element 303 is provided between the gate and the source of the light-emitting transistor 301. Therefore, the second switching element 303 electrically controls connection between the gate and the source of the light-emitting transistor 301, whereby a potential difference (a gate voltage) between the gate and the source of the light-emitting transistor 301 can be controlled.

In addition, in the pixel 400 illustrated in FIG. 6B, one of a pair of electrodes of a storage capacitor 304 is connected to the gate (G) of the light-emitting transistor 301, and the other of the pair of electrodes of the storage capacitor 304 is connected to the power supply line Vi. The storage capacitor 304 in FIG. 6B is not limited to the above configuration. The storage capacitor 304 may have any configuration as long as the potential of the gate of the light-emitting transistor 301 can be held. Therefore, for example, the gate (G) of the light-emitting transistor 301 may be connected to one of the pair of electrodes of the storage capacitor 304 and a constant potential such as the common potential may be applied to the other of the pair of electrodes of the storage capacitor 304. Note that the storage capacitor 304 is not necessarily provided in the case where gate capacitance between the gate and a semiconductor film of the light-emitting transistor 301 is large enough similarly to the pixel 300 illustrated in FIG. 6A.

In the pixel 400 illustrated in FIG. 6B, the potential (VDD) at a higher level than the common potential is applied to the power supply line Vi, but a potential (VSS) at a lower level than the common potential may also be applied to the power supply line Vi. In such a case, the source and the drain of the light-emitting transistor 301 are switched.

Note that in FIGS. 6A and 6B, transistors can be used as the first switching element 302 and the second switching element 303. In addition, as the first and second switching elements 302 and 303, a logic circuit which can control electrical continuity and electrical discontinuity between two terminals, such as a transmission gate using a transistor, can be used.

Figure 7:
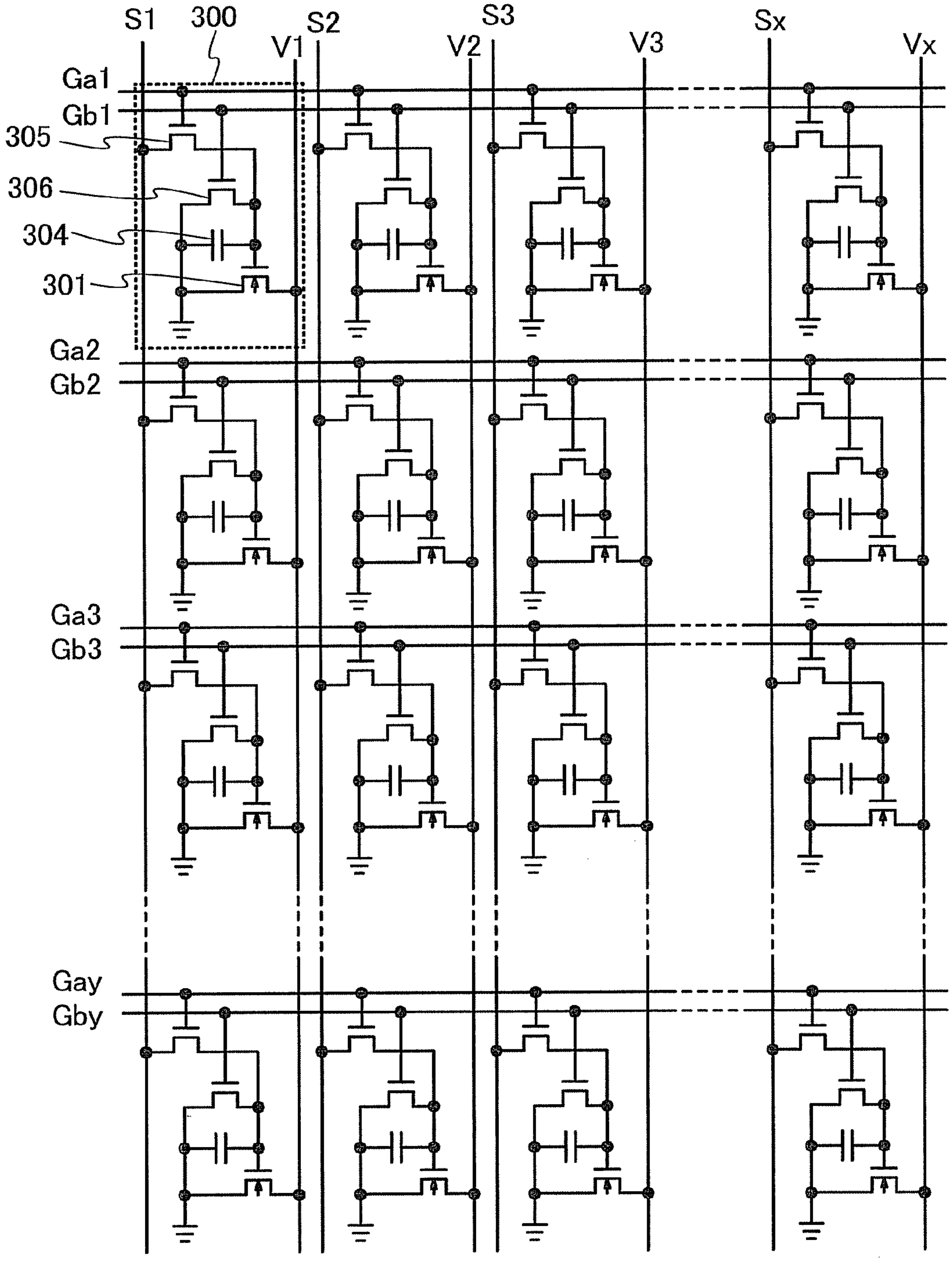
FIG. 7 illustrates an example of a configuration of a pixel portion included in a light-emitting device, which is applicable to the present invention.

FIG. 7 illustrates an example of a circuit diagram of an entire pixel portion in the case where an n-channel transistor 305 and an n-channel transistor 306 are used for the first switching element 302 and the second switching element 303, respectively, in the pixel 300 illustrated in FIG. 6A.

The pixel portion illustrated in FIG. 7 is provided with signal lines S1 to Sx, power supply lines V1 to Vx, first scan lines Ga1 to Gay, and second scan lines Gb1 to Gby. At least one of the signal lines S1 to Sx, one of the power supply lines V1 to Vx, one of the first scan lines Ga1 to Gay, and one of the second scan lines Gb1 to Gby are connected to each pixel 300.

In the pixel portion illustrated in FIG. 7, a gate of the transistor 305 included in each pixel 300 is connected to one of the first scan lines Ga1 to Gay. In addition, one of a source and a drain of the transistor 305 is connected to one of the signal lines S1 to Sx, and the other of the source and the drain is connected to a gate of a light-emitting transistor 301. A gate of the transistor 306 included in each pixel 300 is connected to one of the second scan lines Gb1 to Gby. In addition, the gate of the light-emitting transistor 301 is connected to one of a source and a drain of the transistor 306, and a common potential is applied to the other of the source and the drain.

Figure 8:
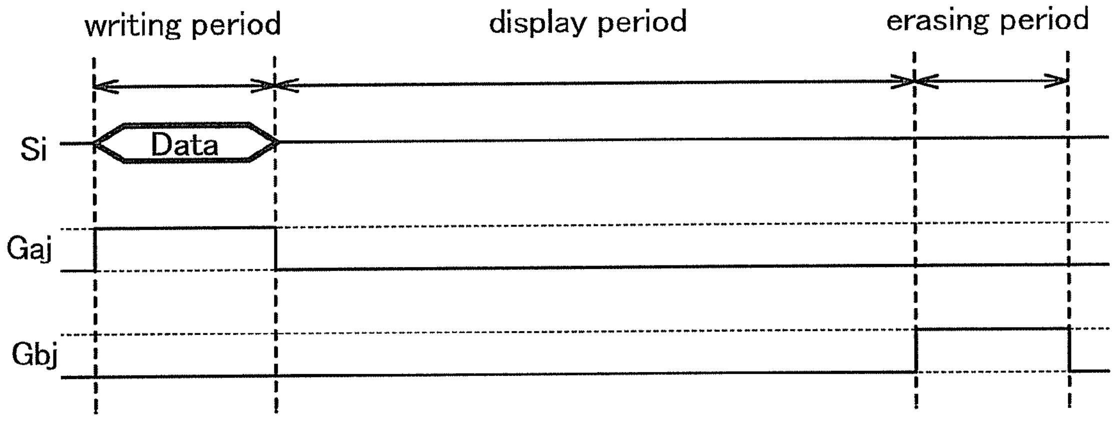
FIG. 8 illustrates an example of a timing chart of a potential which is applied to a pixel included in a light-emitting device, which is applicable to the present invention.

Next, an operation of the pixel portion illustrated in FIG. 7 will be described. The operation of the pixel portion can be described for each of a writing period, a display period, and an erasing period. FIG. 8 is a timing chart of potentials which are applied to the signal line Si (i=1 to x), the first scan line Gaj (j=1 to y), and the second scan line Gbj (j=1 to y). Further, FIGS. 9A to 9C illustrate the operation of a pixel in the above periods. FIGS. 9A to 9C illustrate the case where a high-level potential VDD is applied to the power supply line Vi.

First, in the writing period, the first switching element 302 is turned on and the second switching element 303 is turned off. Specifically, in the pixel 300 included in the pixel portion illustrated in FIG. 7, as illustrated in FIG. 8, a high-level potential is applied to the first scan line Gaj, a low-level potential is applied to the second scan line Gbj, and a potential (VDD) of a video signal of the pixel 300 is applied to the signal line Si. Therefore, as illustrated in FIG. 9A, the transistor 305 is turned on, and the potential of the video signal is applied to the gate of the light-emitting transistor 301 via the transistor 305. In addition, since the transistor 306 is turned off, a potential difference between the gate and the source of the light-emitting transistor 301 is held by a storage capacitor 304.

If the level of the potential (DATA) of the video signal is high and the potential difference between the gate and the source of the light-emitting transistor 301 is greater than or equal to the threshold voltage of the light-emitting transistor 301, a current flows between the source and the drain of the light-emitting transistor 301, so that the light-emitting transistor 301 emits light. On the other hand, if the level of the potential (DATA) of the video signal is low and the potential difference between the gate and the source of the light-emitting transistor 301 is lower than the threshold voltage of the light-emitting transistor 301, a current scarcely flows between the source and the drain, so that the light-emitting transistor 301 does not emit light.

Next, in the display period, the first switching element 302 and the second switching element 303 are turned off. Specifically, in the pixel 300 included in the pixel portion illustrated in FIG. 7, as illustrated in FIG. 8, a low-level potential is applied to the first scan line Gaj, and a low-level potential is applied to the second scan line Gbj. To the signal line Si, a potential (DATA) of a video signal for a pixel 300, which is different from the pixel 300 to which the potential of the video signal is applied in the immediately preceding writing period, is applied. However, since the first switching element 302 is turned off, the potential of the above video signal is not applied to the gate of the light-emitting transistor 301 of this pixel 300.

Accordingly, as illustrated in FIG. 9B, the transistor 305 is turned off, and the potential of the gate of the light-emitting transistor 301 is held. In addition, since the transistor 306 is kept in an off-state, the potential difference between the gate and the source of the light-emitting transistor 301 is held by the storage capacitor 304. Thus, if the light-emitting transistor 301 emits light in the immediately preceding writing period, the light-emitting transistor 301 emits light continuously also in the display period. On the contrary, if the light-emitting transistor 301 does not emit light in the immediately preceding writing period, the light-emitting transistor 301 does not emit light in the display period, either.

Next, in the erasing period, the first switching element 302 is turned off and the second switching element 303 is turned on. Specifically, in the pixel 300 included in the pixel portion illustrated in FIG. 7, as illustrated in FIG. 8, a low-level potential is applied to the first scan line Gaj, and a high-level potential is applied to the second scan line Gbj. Therefore, as illustrated in FIG. 9C, the transistor 305 is kept in an off-state. Further, since the transistor 306 is turned on, the gate and the source of the light-emitting transistor 301 have electrical continuity therebetween, and a pair of electrodes of the storage capacitor 304 are short-circuited, so that electric charge stored in the storage capacitor 304 is discharged.

Therefore, even if the light-emitting transistor 301 emits light in the immediately preceding display period, since the transistor 306 is turned on, there is no potential difference between the gate and the source of the light-emitting transistor 301, and the light-emitting transistor 301 is made not to emit light.

The second switching element 303 is turned on in the erasing period to make the light-emitting transistor 301 not emit light, whereby a black image is inserted. Switching of the second switching element 303 does not depend on image information of a video signal but can be controlled by a potential applied to the second scan line Gbj. Therefore, pseudo-impulse driving can be achieved without inputting a video signal having information of a black image to the pixel. Accordingly, while suppressing the frequency of a signal line driver circuit which supplies a video signal to the signal line, a blur of a moving image can be prevented, without reducing a frame frequency.

Embodiment Mode 3

Figure 10:
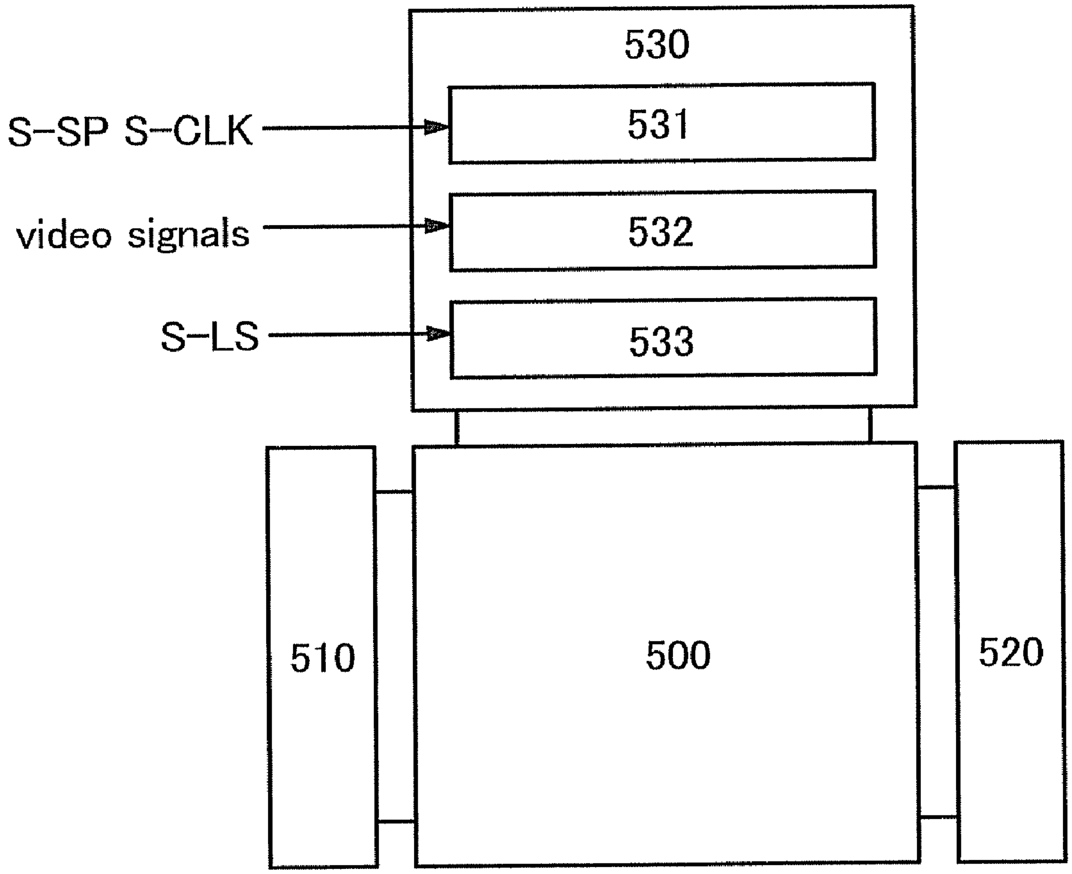
FIG. 10 is a block diagram illustrating an example of a configuration of a driver circuit included in a light-emitting device, which is applicable to the present invention.

In this embodiment mode, examples of a configuration of a driver circuit included in a light-emitting device according to the present invention will be described. FIG. 10 illustrates an example of a block diagram of the light-emitting device according to the present invention.

The light-emitting device illustrated in FIG. 10 includes a pixel portion 500 which has a plurality of pixels each provided with a light-emitting element, a scan line driver circuit 510 which controls a potential of a first scan line, a scan line driver circuit 520 which controls a potential of a second scan line, and a signal line driver circuit 530 which controls input of a video signal to a signal line.

In FIG. 10, the signal line driver circuit 530 includes a shift register 531, a first memory circuit 532, and a second memory circuit 533. A clock signal S-CLK and a start pulse signal S-SP are input to the shift register 531. The shift register 531 generates timing signals, pulses of which sequentially shift, in accordance with the clock signal S-CLK and the start pulse signal S-SP, and outputs the timing signals to the first memory circuit 532. The order of appearance of the pulses of the timing signals may be switched in accordance with a scan direction switching signal.

When the timing signals are input to the first memory circuit 532, video signals are sequentially written into and held in the first memory circuit 532 in accordance with the pulses of the timing signals. Video signals may be sequentially written to a plurality of memory elements included in the first memory circuit 532. Alternatively, the plurality of memory elements included in the first memory circuit 532 may be divided into several groups, and video signals may be input per group at the same time, that is, so-called division driving may be performed. Note that the number of groups at this time is called a division number.

The time until writing of the video signals to all the memory elements in the first memory circuit 532 is completed is called a line period. In practice, the line period sometimes includes a line period to which a horizontal retrace line period is added.

When one line period is completed, the video signals held in the first memory circuit 532 are written to the second memory circuit 533 all at once and held, in accordance with a pulse of a signal S-LS which is input to the second memory circuit 533. Once the first memory circuit 532 has terminated transmitting the video signals to the second memory circuit 533, video signals for the next line period are sequentially written to the first memory circuit 532 in accordance with timing signals from the shift register 531. During this second round of the one line period, the video signals held in the second memory circuit 533 are input to pixels in the pixel portion 500 via signal lines.

Note that the signal line driver circuit 530 may use, instead of the shift register 531, another circuit which can output signals, pulses of which sequentially shift.

Note that the pixel portion 500 is directly connected to the lower stage of the second memory circuit 533 in FIG. 10; however, the present invention is not limited to this configuration. A circuit which performs signal processing on the video signals output from the second memory circuit 533 may be provided at the stage prior to the pixel portion 500. Examples of the circuit which performs signal processing include a buffer which can shape a waveform and the like.

Next, operations of the scan line driver circuit 510 and the scan line driver circuit 520 are described. Each of the scan line driver circuit 510 and the scan line driver circuit 520 includes circuits such as a shift register, a level shifter, and a buffer. The scan line driver circuit 510 and the scan line driver circuit 520 generate signals having the waveform illustrated in the timing chart in FIG. 4 or FIG. 8. By inputting the generated signals to the first scan line or the second scan line, the operation of a switching element in each pixel is controlled.

Note that in the light-emitting device illustrated in FIG. 10, the scan line driver circuit 510 generates signals which are input to the first scan line and the scan line driver circuit 520 generates signals which are input to the second scan line; however, one scan line driver circuit may generate both signals which are input to the first scan line and signals which are input to the second scan line. In addition, for example, there is a possibility that a plurality of the first scan lines and the second scan lines used for controlling the operation of the switching element be provided in each pixel, depending on the number of transistors and the polarity of each transistor included in the switching element. In that case, one scan line driver circuit may generate all signals that are input to the plurality of first scan lines, or a plurality of scan line driver circuits may generate signals that are input to the plurality of first scan lines. Further, one scan line driver circuit may generate all signals that are input to the plurality of second scan lines, or a plurality of scan line driver circuits may generate signals that are input to the plurality of second scan lines.

Note that although the pixel portion 500, the scan line driver circuit 510, the scan line driver circuit 520, and the signal line driver circuit 530 can be provided over the same substrate, any of them can be provided over a different substrate.

Note that in the light-emitting device illustrated in FIG. 10, digital video signals are input to the pixel portion 500. However, by providing a digital-to-analog (DA) converter circuit between the second memory circuit 533 and the pixel portion 500, the digital video signals can be converted to analog video signals before being input to the pixel portion 500.

Figure 11:
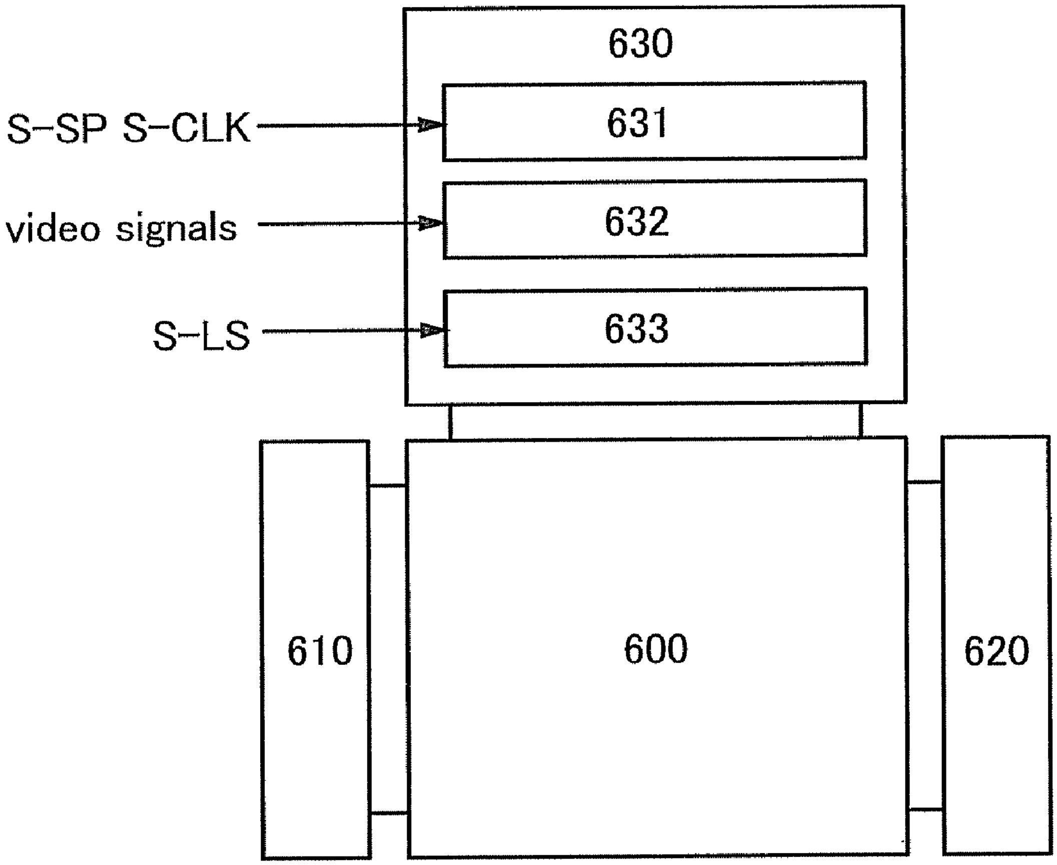
FIG. 11 is a block diagram illustrating an example of a configuration of a driver circuit included in a light-emitting device, which is applicable to the present invention.

In addition, although digital video signals are input to the signal line driver circuit 530 in FIG. 10, the present invention is not limited to this configuration. FIG. 11 illustrates an example of a configuration of a light-emitting device in the case where analog video signals are input to a signal line driver circuit.

The light-emitting device illustrated in FIG. 11 includes a pixel portion 600 which has a plurality of pixels, a scan line driver circuit 610 which controls a potential of a first scan line, a scan line driver circuit 620 which controls a potential of a second scan line, and a signal line driver circuit 630 which controls input of a video signal to a signal line.

The signal line driver circuit 630 includes at least a shift register 631, a sampling circuit 632, and a memory circuit 633 which can store an analog signal. A clock signal S-CLK and a start pulse signal S-SP are input to the shift register 631. The shift register 631 generates timing signals, pulses of which sequentially shift, in accordance with the clock signal S-CLK and the start pulse signal S-SP and inputs the timing signals to the sampling circuit 632. The sampling circuit 632 samples analog video signals for one line period, which are input to the signal line driver circuit 630, in accordance with the timing signals which are input. When all the video signals for one line period are sampled, the sampled video signals are output to the memory circuit 633 all at once and held in accordance with a signal S-LS. The video signals held in the memory circuit 633 are input to the pixel portion 600 via signal lines.

Although this embodiment mode describes an example in which after all the video signals for one line period are sampled in the sampling circuit 632, the sampled video signals are input to the memory circuit 633 at the lower stage all at once, the present invention is not limited to this configuration. Every time each video signal for its respective pixel is sampled in the sampling circuit 632, the sampled video signal can be input to the memory circuit 633 at the lower stage without waiting for the completion of the one line period.

In addition, the video signals may be sampled for their respective pixels sequentially, or pixels in one line may be divided into several groups and the video signals for the pixels in one group may be sampled at the same time.

Note that, although the pixel portion 600 is directly connected to the lower stage of the memory circuit 633 in FIG. 11, the present invention is not limited to this configuration. A circuit which performs signal processing on the analog video signals output from the memory circuit 633 can be provided at the stage prior to the pixel portion 600. Examples of the circuit which performs signal processing include a buffer which can shape a waveform and the like.

Then, at the same time as input of the video signals to the pixel portion 600 from the memory circuit 633, the sampling circuit 632 can sample video signals for the next line period.

Next, operations of the scan line driver circuit 610 and the scan line driver circuit 620 are described. Each of the scan line driver circuit 610 and the scan line driver circuit 620 includes circuits such as a shift register, a level shifter, and a buffer. The scan line driver circuit 610 and the scan line driver circuit 620 generate signals having the waveform illustrated in the timing chart in FIG. 4 or FIG. 8. By inputting the generated signals to the first scan line or the second scan line, the operation of a switching element in each pixel is controlled.

Note that in the light-emitting device illustrated in FIG. 11, the scan line driver circuit 610 generates signals which are input to the first scan line and the scan line driver circuit 620 generates signals which are input to the second scan line; however, one scan line driver circuit may generate both signals which are input to the first scan line and signals which are input to the second scan line. In addition, for example, there is a possibility that a plurality of the first scan lines and the second scan lines used for controlling the operation of the switching element be provided in each pixel, depending on the number of transistors and the polarity of each transistor included in the switching element. In that case, one scan line driver circuit may generate all signals that are input to the plurality of first scan lines, or a plurality of scan line driver circuits may generate signals that are input to the plurality of first scan lines. Further, one scan line driver circuit may generate all signals that are input to the plurality of second scan lines, or a plurality of scan line driver circuits may generate signals that are input to the plurality of second scan lines.

Note that although the pixel portion 600, the scan line driver circuit 610, the scan line driver circuit 620, and the signal line driver circuit 630 can be provided over the same substrate, any of them can be provided over a different substrate.

In the light-emitting device of this embodiment mode, either a digital video signal or an analog video signal may be input to the pixel. In the case of inputting the digital video signal, grayscale can be displayed using an area ratio grayscale method or a time ratio grayscale method. An area ratio grayscale method refers to a driving method by which one pixel is divided into a plurality of sub-pixels and each sub-pixel is driven independently based on a video signal so that grayscale is displayed. Further, a time ratio grayscale method refers to a driving method by which a period during which a pixel is in a light-emitting state is controlled so that grayscale is displayed.

Since the response speed of a light-emitting element is higher than that of a liquid crystal element or the like, a light-emitting element is more suitable for display using a time ratio grayscale method than a liquid crystal element. In the case of performing display with a time ratio grayscale method, one frame period is divided into a plurality of sub-frame periods. Then, in accordance with a video signal, a light-emitting element in a pixel is set in a light-emitting state or a non-light-emitting state in each sub-frame period. With the above structure, the total length of a period during which the pixel is actually in a light-emitting state in one frame period can be controlled with the video signal, so that grayscale can be displayed.

In this embodiment mode, a writing period and a display period are provided in each of all the sub-frame periods included in one frame period. In addition, at least one of all the sub-frame periods is provided with an erasing period in addition to the writing period and the display period. Moreover, the writing period, the display period, and the erasing period may be provided in each of all the sub-frame periods.

Further, in the case of a time ratio grayscale method, when the number of sub-frame periods is increased in order to increase gray levels, the length of each sub-frame period is shortened if the length of one frame period is fixed. In the light-emitting device in this embodiment mode, during a pixel portion writing period, that is, after a writing period is started in a first pixel in a pixel portion until a writing period is finished in the last pixel, an erasing period is sequentially started from a pixel in which the writing period is finished first and a display period is started so that the light-emitting element can be made not to emit light. Thus, an increase in driving frequency of a driver circuit can be suppressed and the length of the sub-frame period can be made shorter than that of a pixel portion writing period, so that gray levels can be increased.

This embodiment mode can be implemented in combination with any of the above embodiment modes and embodiments as appropriate.

Embodiment 1

In this embodiment, a structural example of a light-emitting transistor applicable to the light-emitting device of the present invention will be specifically described.

Light-emitting elements utilizing electroluminescence are classified according to whether a light-emitting material is an organic compound or an inorganic compound. In general, the former is referred to as an organic light-emitting element, and the latter is referred to as an inorganic light-emitting element.

In an organic light-emitting element, by application of a voltage to a pair of electrodes, electrons and holes are injected from the pair of electrodes into a layer including a light-emitting organic compound. The injected electron and hole form an exciton, and light (electroluminescence) is emitted when the electron and hole of the exciton are recombined at a given level. In addition, since the injected electrons and holes are recombined, a recombination current flows through the light-emitting element. Owing to such a mechanism, this kind of light-emitting element is referred to as a current-excitation type light-emitting element.

Inorganic light-emitting elements are classified into dispersion-type inorganic light-emitting elements and thin-film type inorganic light-emitting elements, depending on their element structures. The former include a semiconductor layer in which particles of a light-emitting material are dispersed in a binder, and the latter include a semiconductor layer formed of a thin film of a light-emitting material. As a light emission mechanism of inorganic light-emitting elements, there are donor-acceptor recombination-type light emission that utilizes a donor level and an acceptor level and localized-type light emission that utilizes inner-shell electron transition of a metal ion. In general, donor-acceptor recombination-type light emission is employed in dispersion type inorganic light-emitting elements and localized-type light emission is employed in thin-film type inorganic light-emitting elements in many cases.

In this embodiment, a thin-film type inorganic light-emitting element having a structure of a field-effect transistor will be described. In the thin-film type inorganic light-emitting element, light is emitted by applying a DC voltage between a pair of electrode layers which sandwich a semiconductor layer.

Figure 12A:
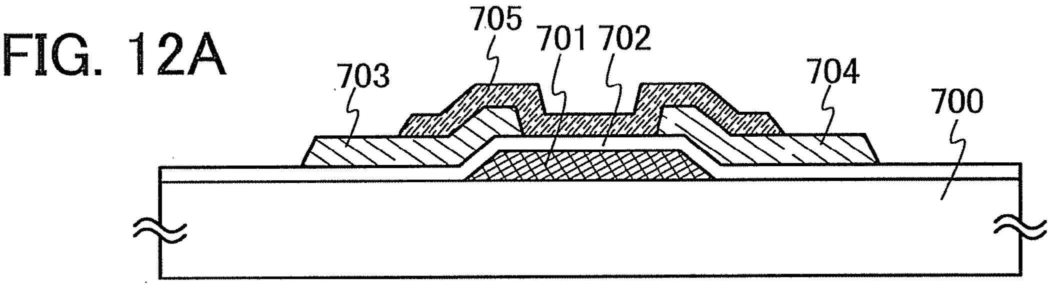
FIGS. 12A to 12D each illustrate an example of a cross-sectional structure of a light-emitting transistor included in a light-emitting device, which is applicable to the present invention.

A light-emitting transistor illustrated in FIG. 12A has, as well as an inverted-staggered structure, a bottom contact structure in which a semiconductor layer is formed over an electrode serving as a source (a source electrode) and an electrode serving as a drain (a drain electrode). In FIG. 12A, an electrode 701 serving as a gate (a gate electrode 701) is formed over a substrate 700 having an insulating surface, and a gate insulating film 702 is formed over the gate electrode 701. In addition, a source electrode 703 and a drain electrode 704 are formed so as to partly overlap with the gate electrode 701 with the gate insulating film 702 interposed therebetween. A semiconductor layer 705 is formed over the source electrode 703, the drain electrode 704, and the gate insulating film 702. A current flows between the source electrode 703 and the drain electrode 704 of the light-emitting transistor, whereby the semiconductor layer 705 emits light.

Figure 12B:
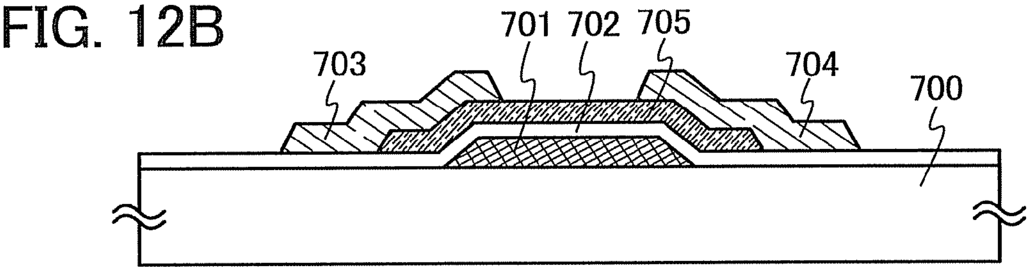

In addition, as illustrated in FIG. 12B, a light-emitting transistor having both a top contact structure in which a source electrode and a drain electrode are formed over a semiconductor layer and an inverted-staggered structure can be applied to the light-emitting device of the present invention. In FIG. 12B, a gate electrode 701 is formed over a substrate 700 having an insulating surface, and a gate insulating film 702 is formed over the gate electrode 701. Further, a semiconductor layer 705 is formed so as to overlap with the gate electrode 701 with the gate insulating film 702 interposed therebetween, and a source electrode 703 and a drain electrode 704 are formed so as to partly cover the semiconductor layer 705. Note that each of the source electrode 703 and the drain electrode 704 is preferably formed so as to overlap with an end portion of the gate electrode 701 with the semiconductor layer 705 and the gate insulating film 702 interposed therebetween. A current flows between the source electrode 703 and the drain electrode 704 of the light-emitting transistor, whereby the semiconductor layer 705 emits light.

Figure 12C:
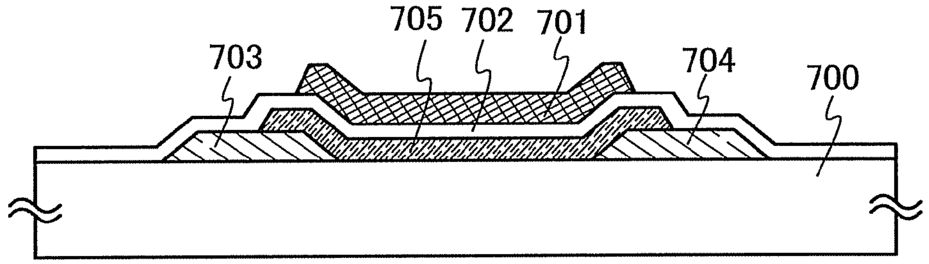

In addition, as illustrated in FIG. 12C, a light-emitting transistor having a staggered structure can be applied to the light-emitting device of the present invention. In FIG. 12C, a source electrode 703 and a drain electrode 704 are formed over a substrate 700 having an insulating surface, and a semiconductor layer 705 is formed over the source electrode 703 and the drain electrode 704. A gate insulating film 702 is formed over the semiconductor layer 705, the source electrode 703, and the drain electrode 704, and a gate electrode 701 is formed so as to overlap with the semiconductor layer 705 with the gate insulating film 702 interposed therebetween. Note that the gate electrode 701 is preferably formed so as to overlap with an end portion of each of the source electrode 703 and the drain electrode 704 with the semiconductor layer 705 and the gate insulating film 702 interposed therebetween. A current flows between the source electrode 703 and the drain electrode 704 of the light-emitting transistor, whereby the semiconductor layer 705 emits light.

Figure 12D:
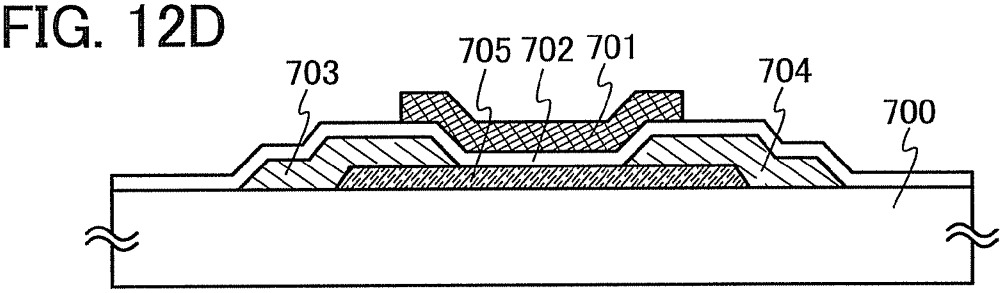

In addition, as illustrated in FIG. 12D, a light-emitting transistor having a coplanar structure can be applied to the light-emitting device of the present invention. In FIG. 12D, a semiconductor layer 705 is formed over a substrate 700 having an insulating surface, and a source electrode 703 and a drain electrode 704 are formed over the semiconductor layer 705 so as to partly overlap with the semiconductor layer 705. A gate insulating film 702 is formed over the semiconductor layer 705, the source electrode 703, and the drain electrode 704, and a gate electrode 701 is formed so as to overlap with the semiconductor layer 705 with the gate insulating film 702 interposed therebetween. Note that the gate electrode 701 is preferably formed so as to overlap with an end portion of each of the source electrode 703 and the drain electrode 704 with the gate insulating film 702 interposed therebetween. A current flows between the source electrode 703 and the drain electrode 704 of the light-emitting transistor, whereby the semiconductor layer 705 emits light.

Figure 13A:
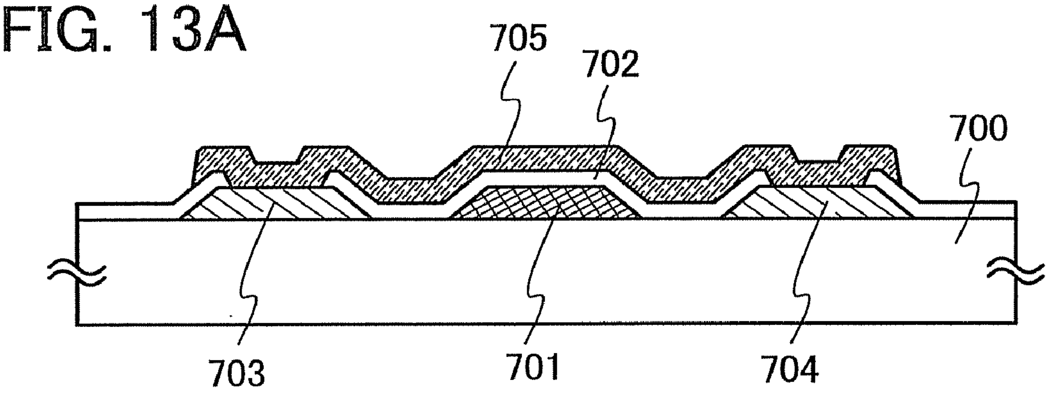
FIGS. 13A and 13B each illustrate an example of a cross-sectional structure of a light-emitting transistor included in a light-emitting device, which is applicable to the present invention.

In addition, as illustrated in FIG. 13A, a light-emitting transistor having an inverted-coplanar structure can be applied to the light-emitting device of the present invention. In FIG. 13A, a gate electrode 701, a source electrode 703, and a drain electrode 704 are formed over a substrate 700 having an insulating surface, and a gate insulating film 702 is formed over the gate electrode 701, the source electrode 703, and the drain electrode 704. A semiconductor layer 705 is formed so as to overlap with the gate electrode 701, the source electrode 703, and the drain electrode 704 with the gate insulating film 702 interposed therebetween. Note that the semiconductor layer 705 is connected to the source electrode 703 and the drain electrode 704 through openings formed in the gate insulating film 702. A current flows between the source electrode 703 and the drain electrode 704 of the light-emitting transistor, whereby the semiconductor layer 705 emits light.

Figure 13B:
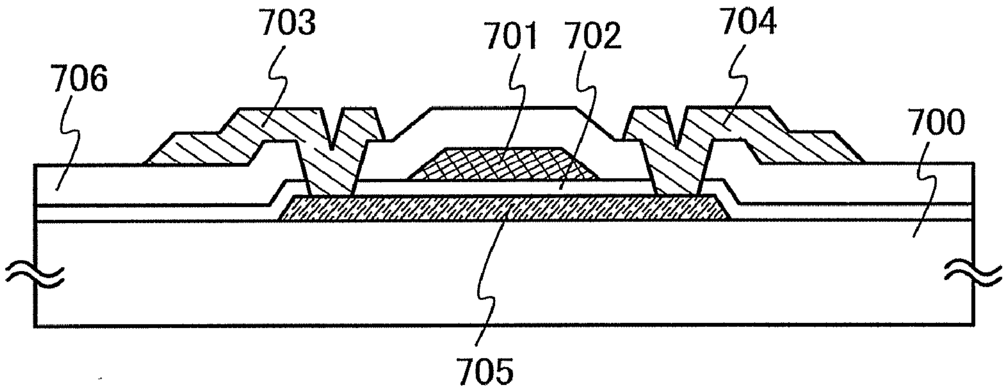

In addition, as illustrated in FIG. 13B, a light-emitting transistor having a coplanar structure which is different from that illustrated in FIG. 12D can be applied to the light-emitting device of the present invention. In FIG. 13B, a semiconductor layer 705 is formed over a substrate 700 having an insulating surface, and a gate insulating film 702 is formed over the semiconductor layer 705. In addition, a gate electrode 701 is formed so as to overlap with the semiconductor layer 705 with the gate insulating film 702 interposed therebetween. An interlayer insulating film 706 is formed over the gate electrode 701 and the gate insulating film 702, and a source electrode 703 and a drain electrode 704 which are connected to the semiconductor layer 705 are formed over the interlayer insulating film 706. Note that the source electrode 703 and the drain electrode 704 are connected to the semiconductor layer 705 through openings formed in the gate insulating film 702 and the interlayer insulating film 706. A current flows between the source electrode 703 and the drain electrode 704 of the light-emitting transistor, whereby the semiconductor layer 705 emits light.

As the substrate 700, a glass substrate, a quartz substrate, a sapphire substrate, a metal substrate or a stainless steel substrate each having a surface provided with an insulating layer, a plastic substrate having heat resistance that is high enough to resist the treatment temperature of the process, or the like can be used. As the plastic substrate, typically, a substrate including PET (polyethylene terephthalate), PEN (polyethylene naphthalate), PES (polyethersulfone), polypropylene, polypropylene sulfide, polycarbonate, polyetherimide, polyphenylene sulfide, polyphenylene oxide, polysulfone, polyphthalamide, or the like can be used. The light-emitting transistor of this embodiment can be formed by a method which does not require a high-temperature process, such as an evaporation method or a sputtering method. Accordingly, the light-emitting transistor can be formed directly on the plastic substrate.

Alternatively, the light-emitting transistor may be formed after an insulating film is formed over a substrate. In this case, the insulating film can be formed using an insulating film including silicon oxide, silicon nitride, silicon oxynitride, silicon nitride oxide, aluminum nitride, or the like by a sputtering method, a plasma CVD method, a coating method, a printing method, or the like. The insulating film over the substrate can be a single layer or have a layered structure. The thickness of the insulating film is preferably 50 to 200 nm.

Note that a silicon oxynitride film means a film that includes more oxygen than nitrogen and, in the case where measurements are performed using Rutherford backscattering spectrometry (RBS) and hydrogen forward scattering (HFS), includes oxygen, nitrogen, silicon, and hydrogen at concentrations ranging from 50 to 70 at. %, 0.5 to 15 at. %, 25 to 35 at. %, and 0.1 to 10 at. %, respectively. Further, a silicon nitride oxide film means a film that includes more nitrogen than oxygen and, in the case where measurements are performed using RBS and HFS, includes oxygen, nitrogen, silicon, and hydrogen at concentrations ranging from 5 to 30 at. %, 20 to 55 at. %, 25 to 35 at. %, and 10 to 25 at. %, respectively. Note that percentages of nitrogen, oxygen, silicon, and hydrogen fall within the ranges given above, where the total number of atoms included in the silicon oxynitride film or the silicon nitride oxide film is defined as 100 at. %.

The gate electrode 701 can be formed by a sputtering method, a plasma CVD method, a coating method, a printing method, an ink-jet method, an electrolytic plating method, an electroless plating method, or the like by using a conductive film formed of a metal, an alloy, a compound, or the like having conductivity with a single layer structure or a layered structure.

As the metal, alloy, compound, or the like having conductivity, for example, a conductive metal oxide having a light-transmitting property such as indium tin oxide (hereinafter, referred to as ITO), indium tin oxide including silicon, or indium oxide including zinc oxide (ZnO) at 2 to 20 at. % is given. In addition, titanium (Ti), gold (Au), platinum (Pt), nickel (Ni), tungsten (W), chromium (Cr), molybdenum (Mo), iron (Fe), cobalt (Co), copper (Cu), palladium (Pd), a nitride of the metal material (e.g., titanium nitride, tungsten nitride, or molybdenum nitride) or the like can be used. Furthermore, a metal belonging to Group 1 or 2 of the periodic table, i.e., an alkali metal such as lithium (Li) or cesium (Cs) or an alkaline earth metal such as magnesium (Mg), calcium (Ca), or strontium (Sr), aluminum (Al), an alloy including any of these (such as MgAg or AlLi), a rare earth metal such as europium (Er) or ytterbium (Yb), an alloy including the rare earth metal, or the like can be used.

Preferably, the gate insulating film 702 has high withstand voltage and is a dense film. Further, the gate insulating film 702 preferably has a high dielectric constant. For a typical example, silicon oxide ($SiO_2$), yttrium oxide ($Y_2O_3$), titanium oxide ($TiO_2$), aluminum oxide ($Al_2O_3$), hafnium oxide ($HfO_2$), tantalum oxide ($Ta_2O_5$), barium titanate ($BaTiO_3$), strontium titanate ($SrTiO_3$), lead titanate ($PbTiO_3$), silicon nitride ($Si_3N_4$), silicon nitride oxide (SiNO), silicon oxynitride (SiON), zirconium oxide ($ZrO_2$), or the like can be used. Alternatively, a mixed film of any of these materials or a film with a layered structure including two or more of these materials can be used. The gate insulating film 702 can be formed by a sputtering method, an evaporating method, a CVD method, a printing method, or the like.

The source electrode 703 and the drain electrode 704 are preferably formed using a combination of a low-resistance material such as aluminum (Al) and a barrier metal using a high-melting-point metal material such as titanium (Ti) or molybdenum (Mo), e.g., a layered structure of titanium (Ti) and aluminum (Al) or a layered structure of molybdenum (Mo) and aluminum (Al). The source electrode 703 and the drain electrode 704 are not limited to the above structure and can be formed using a metal or a metal compound as appropriate. The source electrode 703 and the drain electrode 704 can be formed by a sputtering method, an evaporation method, a CVD method, a printing method, or the like.

In the light-emitting transistor illustrated in FIG. 13A, the source electrode 703 and the drain electrode 704 can be formed with the same material and the same layered structure as those of the gate electrode 701.

The semiconductor layer 705 is formed using a light-emitting material which includes a base material and an impurity element to be a luminescence center. Light emission of various colors can be obtained by varying impurity elements to be included in a light-emitting material. As a method for manufacturing a light-emitting material, various methods such as a solid phase method and a liquid phase method (a coprecipitation method) can be used. In addition, a spray pyrolysis method, a double decomposition method, a method by thermal decomposition reaction of a precursor, a method in which any of these methods and high-temperature baking are combined, a liquid phase method such as a freeze-drying method, or the like can be used.

The solid phase method is a method in which a base material and an impurity element or a compound including the impurity element are weighed, mixed in a mortar, and reacted with each other by being heated and baked in an electric furnace so that the impurity element is made to be included in the base material. The baking temperature is preferably 700 to 1500° C. This is because solid phase reaction is not progressed at a temperature that is too low and the base material is decomposed at a temperature that is too high. The baking may be conducted in a powder state; however, the baking is preferably conducted in a pellet state. This method requires baking at a temperature that is comparatively high but is simple and, thus, this method has high productivity and is suitable for mass production.

The liquid phase method (coprecipitation method) is a method in which a base material or a compound including the base material and an impurity element or a compound including the impurity element are reacted with each other in a solution, dried, and then, baked. By this method, particles of a light-emitting material are uniformly dispersed, the particle has a small diameter, and reaction can progress even at low baking temperature.

As a base material for the light-emitting material, a sulfide, an oxide, a nitride, a carbide, or the like can be used. The sulfide can be, for example, zinc sulfide (ZnS), cadmium sulfide (CdS), calcium sulfide (CaS), yttrium sulfide ($Y_2S_3$), gallium sulfide ($Ga_2S_3$), strontium sulfide (SrS), barium sulfide (BaS), or the like. The oxide can be, for example, zinc oxide (ZnO), yttrium oxide ($Y_2O_3$), $Mg_xZn_{1-x}O$, or the like. The nitride can be, for example, aluminum nitride (AlN), gallium nitride (GaN), indium nitride (InN), or the like. The carbide can be, for example, silicon carbide (SiC) or diamond. In addition, as the base material, zinc selenide (ZnSe), zinc telluride (ZnTe), or the like can also be used. Further, a ternary mixed crystal such as calcium gallium sulfide ($CaGa_2S_4$), strontium-gallium sulfide ($SrGa_2S_4$), or barium-gallium sulfide ($BaGa_2S_4$) can also be used.

As a luminescence center of the localized-type light emission, manganese (Mn), copper (Cu), samarium (Sm), terbium (Tb), erbium (Er), thulium (Tm), europium (Eu), cerium (Ce), praseodymium (Pr), gold (Au), silver (Ag), or the like can be used. As charge compensation, a halogen element such as fluorine (F) or chlorine (Cl) may be added.

On the other hand, as a luminescence center of the donor-acceptor recombination-type light emission, a light-emitting material including a first impurity element forming a donor level and a second impurity element forming an acceptor level can be used. As the first impurity element, for example, fluorine (F), chlorine (Cl), aluminum (Al), or the like can be used. As the second impurity element, for example, copper (Cu), silver (Ag), or the like can be used.

In the case of synthesizing a light-emitting material for the donor-acceptor recombination-type light emission by using a solid-phase method, the following steps are performed: weighing a base material, weighing a first impurity element or a compound including the first impurity element, weighing a second impurity element or a compound including the second impurity element, mixing them in a mortar, and heating and baking them in an electric furnace. As the base material, the base material as described above can be used, and as the first impurity element or the compound including the first impurity element, for example, fluorine (F), chlorine (Cl), aluminum sulfide ($Al_2S_3$), or the like can be used. As the second impurity element or the compound including the second impurity element, for example, copper (Cu), silver (Ag), copper sulfide ($Cu_2S$), silver sulfide ($Ag_2S$), or the like can be used. The baking temperature is preferably 700 to 1500° C. This is because solid phase reaction is not progressed at a temperature that is too low and the base material is decomposed at a temperature that is too high. The baking may be conducted in a powder state; however, the baking is preferably conducted in a pellet state.

In addition, as an impurity element in the case of utilizing the solid phase reaction, a compound including a first impurity element and a second impurity element may also be used. In this case, since the impurity elements are easily diffused to promote the solid phase reaction, a uniform light-emitting material can be obtained. Moreover, since the impurity element is not included excessively, a light-emitting material with high purity can be obtained. As the compound including the first impurity element and the second impurity element, for example, copper chloride (CuCl), silver chloride (AgCl), or the like can be given.

Note that the concentration of these impurity elements may be 0.01 to 10 at. %, preferably 0.05 to 5 at. %, with respect to the base material.

In the case of a thin-film type inorganic light-emitting element, the semiconductor layer 705 can be formed using the above-mentioned light-emitting material, by a vacuum evaporation method such as a resistance heating evaporation method or an electron-beam evaporation (EB evaporation) method, a physical vapor deposition (PVD) method such as a sputtering method, a chemical vapor deposition (CVD) method such as a metal organic CVD method or a low-pressure hydride transport CVD method, an atomic layer epitaxy (ALE) method, or the like. The semiconductor layer 705 may also be formed in such a manner that a film including the light-emitting material is formed over a substrate by any of the above methods, and then the film including the light-emitting material is selectively etched using a resist mask formed through a photolithography process. As such an etching method, a dry etching method, a wet etching method, or the like can be used. For example, in the case where a base material of the film including the light-emitting material is ZnS, a mixed gas of $CF_4$ and $O_2$, a mixed gas of $BCl_3$ and $Cl_2$, $Cl_2$, or the like can be used as an etching gas.

In accordance with Snell's law, when light emitted from a light-emitting transistor enters a substance with a low refractive index from a substance with a high refractive index, light with an incident angle greater than or equal to the critical angle having a certain value is totally reflected. On the other hand, when light enters a substance with a high refractive index from a substance with a low refractive index, the light is not reflected but transmitted. By utilizing this principle, light emitted from the light-emitting transistor can be efficiently extracted.

For example, a light-blocking material is used for the gate electrode 701, and a material with a lower refractive index than that of the semiconductor layer 705 is used for the gate insulating film 702, whereby light generated in the semiconductor layer 705 is reflected at the interface between the semiconductor layer 705 and the gate insulating film 702. Accordingly, emitted light can be efficiently extracted to the side opposite to the substrate 700.

Furthermore, a light-transmitting material is used for the gate electrode 701, and a material with a higher refractive index than that of the semiconductor layer 705 is used for the gate insulating film 702, whereby light generated in the semiconductor layer 705 can be extracted in two directions, i.e., the substrate 700 side and the side opposite to the substrate

700. Accordingly, a light-emitting device capable of dual-emission can be manufactured.

Since the refractive index of the material for forming the semiconductor layer 705 is about 2, a material with a refractive index lower than 2 may be used for forming the gate insulating film 702 in the case of a light-emitting transistor having a structure in which light emitted is extracted to the side opposite to the substrate 700. Examples of such a material for the gate insulating film 702 include silicon oxide ($SiO_2$), hafnium oxide ($HfO_2$), aluminum oxide ($Al_2O_3$), and the like. On the other hand, in the case of a light-emitting transistor having a structure in which light generated in the semiconductor layer 705 is extracted in two directions, i.e., the substrate 700 side and the side opposite to the substrate 700, a material with a refractive index higher than 2 may be used for forming the gate insulating film 702. Examples of such a material for the gate insulating film 702 include silicon nitride (SiN), barium titanate ($BaTiO_3$), titanium oxide ($TiO_2$), zirconium oxide ($ZrO_2$), tantalum oxide ($Ta_2O_5$), niobium oxide ($Nb_2O_5$), and the like.

The interlayer insulating film 706 can be formed to have a single layer structure or a layered structure, using an insulating film including an inorganic compound such as silicon oxide, silicon nitride, silicon oxynitride, or silicon nitride oxide by a sputtering method, a plasma CVD method, a coating method, a printing method, or the like. In addition, the interlayer insulating film 706 can be formed using polyimide, acrylic, or a siloxane polymer.

By applying a voltage greater than or equal to the threshold voltage to the gate electrode 701 of the light-emitting transistor, electric charge is induced at the interface between the gate insulating film 702 and the semiconductor layer 705. The induced electric charge is accelerated by a voltage applied between the source electrode 703 and the drain electrode 704, and collides with light-emitting atoms in the semiconductor layer 705, whereby inner-shell electrons of the light-emitting atoms are excited. When energy relaxation occurs in the excited electrons, the energy is emitted in the form of light. Since much electric charge is supplied to the semiconductor layer 705 in the light-emitting transistor, the light-emitting efficiency can be increased and the driving voltage can be reduced.

The light-emitting transistor described in this embodiment has a field-effect transistor structure, so that a large number of carriers can be injected to the semiconductor layer. Therefore, in the case where a light-emitting material that is an inorganic compound is used for the semiconductor layer 705, the light-emitting efficiency can be increased and the driving voltage can be reduced, compared to a light-emitting element having a simple layered structure. Further, by providing the light-emitting transistor in a pixel portion, the driving voltage of a light-emitting device can be reduced.

The polarity of a light-emitting transistor using an inorganic compound as a light-emitting material depends on the polarity of the semiconductor layer 705. By selecting a light-emitting material for the semiconductor layer 705 as appropriate, it is possible to form either an n-channel light-emitting transistor or a p-channel light-emitting transistor. For example, by using zinc oxide (ZnO), $Mg_xZn_{1-x}O$, zinc sulfide (ZnS), or cadmium sulfide (CdS) for the base material of the semiconductor layer 705, an n-channel light-emitting transistor can be formed. Alternatively, by using zinc telluride (ZnTe) for the base material of the semiconductor layer 705, a p-channel light-emitting transistor can be formed.

In this embodiment, the structure of the inorganic light-emitting transistor is described. However, an organic light-emitting transistor can also be applied to the light-emitting device of the present invention. The organic light-emitting transistor can be formed by using an organic semiconductor for the semiconductor layer 705.

As the organic semiconductor for the semiconductor layer 705 of the organic light-emitting transistor, any of a low molecular compound, an intermolecular compound (that is not sublimable and has a molecular chain length less than or equal to 10 μm), and a high molecular compound can be used as long as it is an organic material which has a carrier-transporting property and can cause modulation in the carrier density by an electric field effect.

For example, as an organic semiconductor for forming a p-channel organic light-emitting transistor, the following compounds can be used. As a low molecular compound, a polycyclic aromatic compound such as pentacene or naphthacene, a conjugated double bond compound, a macrocycle compound or a complex thereof, phthalocyanine, a charge transfer type complex, or a tetrathiafulvalene-tetracyanoquinodimethane complex can be used. In addition, as a high molecular compound, a π-conjugated polymer, a charge transfer type complex, polyvinyl pyridine, a phthalocyanine metal complex, or the like can be used. In particular, polyacetylene, polyaniline, polypyrrole, polythienylene, a polythiophene derivative, or the like which is a π-conjugated polymer constituted by a conjugated double bond can be used.

In addition, as an organic semiconductor for forming an n-channel organic light-emitting transistor, perylenetetracarboxylic acid anhydride or a derivative thereof, a perylenetetracarboxydiimie derivative, naphthalenetetracarboxylic acid anhydride or a derivative thereof, a naphthalenetetracarboxydiimide derivative, a metallophthalocyanine derivative, fullerene, or the like, can be used.

The semiconductor layer 705 using the organic semiconductor described above can be formed by a known method such as an evaporation method, a spin-coating method, a dipping method, a silkscreen method, a spray method, or a droplet discharge method.

As the source electrode 703 and the drain electrode 704 of the organic light-emitting transistor, the following materials can be used: a metal such as platinum (Pt), gold (Au), aluminum (Al), chromium (Cr), nickel (Ni), cobalt (Co), copper (Cu), titanium (Ti), magnesium (Mg), calcium (Ca), barium (Ba), or sodium (Na); an alloy including any of the metals; a conductive high molecular compound such as polyaniline, polypyrrole, polythiophene, polyacetylene, or polydiacetylene; an inorganic semiconductor such as silicon, germanium, or gallium arsenide; a carbon material such as carbon black, fullerene, carbon nanotube, or graphite; the conductive high molecular compound, the inorganic semiconductor, or the carbon material doped with acid (including Lewis acid), a halogen atom, or a metal atom of an alkali metal, an alkaline earth metal, or the like; and the like.

The gate insulating film 702 of the organic light-emitting transistor can be formed using an organic insulating material such as acrylic or polyimide or a siloxane based material, in addition to the inorganic insulating material. In siloxane, a skeleton structure is formed of a bond of silicon and oxygen, and a compound at least including hydrogen (such as an alkyl group or aromatic hydrocarbon) is used as a substituent. Fluorine may also be used as a substituent. Moreover, fluorine and a compound at least including hydrogen may be used as a substituent. In addition, the gate insulating film 702 may be formed using a single layer or a plurality of layers. When the gate insulating film 702 includes two layers, an inorganic insulating material as a first insulating layer and an organic insulating material as a second insulating layer are preferably stacked. The gate insulating film 702 using an organic material or a siloxane based material can be formed by a coating method.

The polarity (p-type or n-type) of the light-emitting transistor using the organic semiconductor depends on not only a material for the organic semiconductor but also a relation of work functions of the organic semiconductor and the source and drain electrodes which inject carriers. Therefore, the organic light-emitting transistor can be p-type, n-type, or bipolar regardless of the material for the organic semiconductor. In order to select the polarity (p-type or n-type) of the organic light-emitting transistor, it is necessary to consider the relation of work functions of the organic semiconductor and the source and drain electrodes, and the intensity of an electric field for carrier injection, in addition to selection of the appropriate material for the organic semiconductor.

This embodiment can be implemented in combination with any of the above embodiment modes as appropriate.

Embodiment 2

In this embodiment, an example of a configuration of a pixel included in the light-emitting device according to the present invention will be described.

Figure 14A:
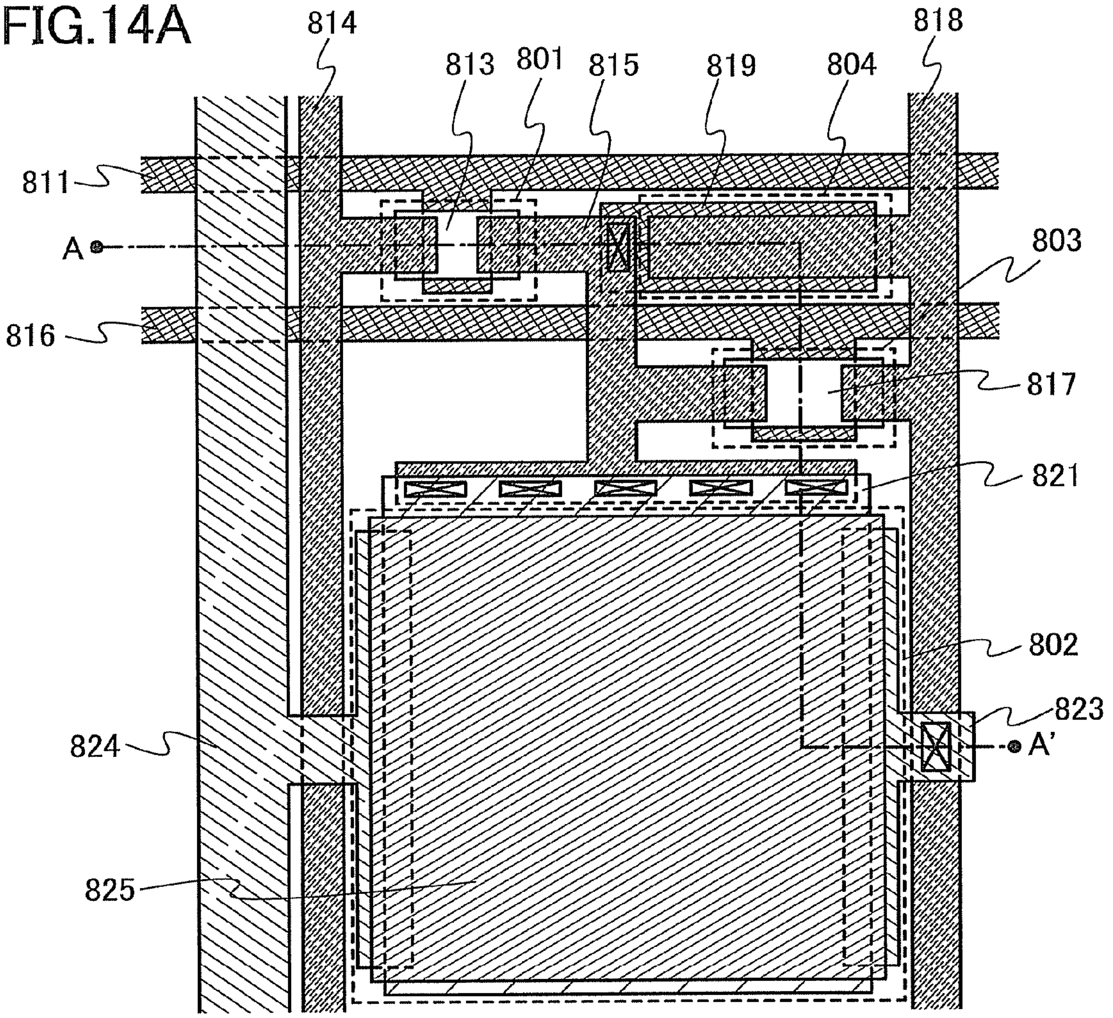
FIG. 14A is a top view and FIG. 14B is a circuit diagram each illustrating an example of a configuration of a pixel included in a light-emitting device, which is applicable to the present invention.
Figure 14B:
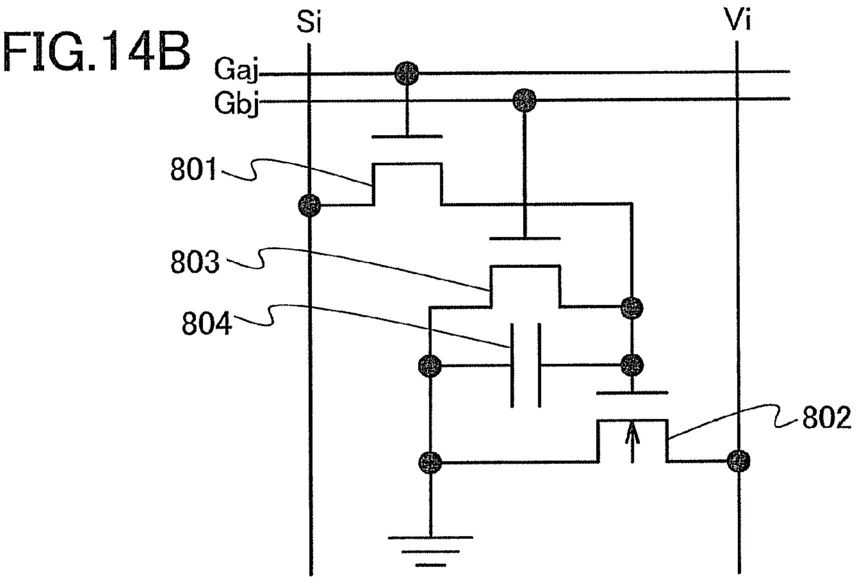
Figure 15:
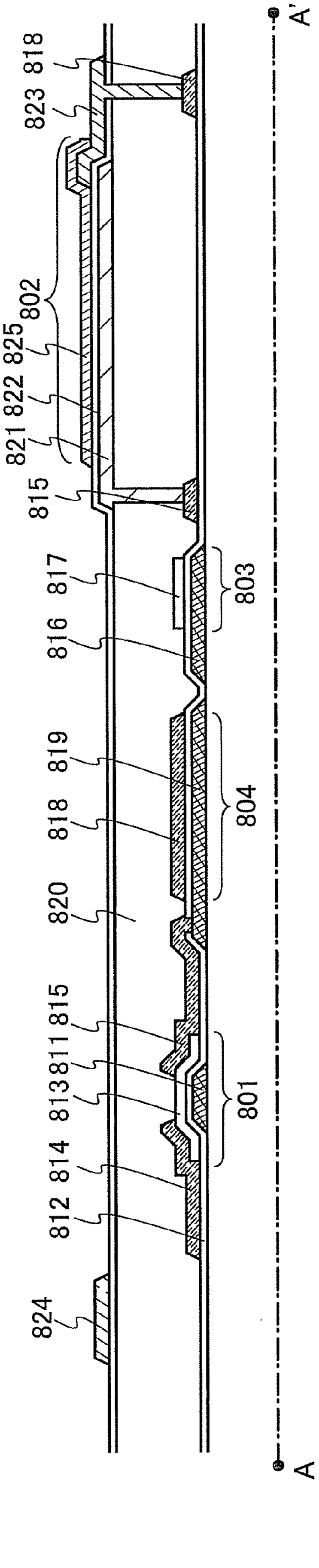
FIG. 15 illustrates an example of a cross-sectional structure of a pixel included in a light-emitting device, which is applicable to the present invention.

FIG. 14A is a top view of a pixel of this embodiment. FIG. 14B is a circuit diagram of the pixel illustrated in FIG. 14A. FIG. 15 is a cross-sectional view taken along dashed line A-A' in the top view of FIG. 14A.

Note that FIG. 14B is a circuit diagram in the case where transistors are used for the first switching element 302 and the second switching element 303 of the pixel illustrated in FIG. 6A. In the circuit diagram of the pixel illustrated in FIG. 14B, a gate of a transistor 801 used as the first switching element is connected to a first scan line Gaj. In addition, one of a source and a drain of the transistor 801 is connected to a signal line Si and the other of the source and the drain is connected to a gate of a light-emitting transistor 802. A gate of a transistor 803 used as the second switching element is connected to a second scan line Gbj. In addition, the gate of the light-emitting transistor 802 is connected to one of a source and a drain of the transistor 803, and a common potential is applied to the other of the source and the drain of the transistor 803. In the pixel illustrated in FIG. 14B, a storage capacitor 804 is provided so as to hold the potential of the gate of the light-emitting transistor 802. Specifically, the gate of the light-emitting transistor 802 is connected to one of a pair of electrodes of the storage capacitor 804, and the common potential is applied to the other of the pair of electrodes of the storage capacitor 804.

As illustrated in FIGS. 14A and 14B, in the pixel described in this embodiment, the transistor 801 includes a conductive film 811 formed over an insulating surface, an insulating film 812 formed over the conductive film 811, a semiconductor layer 813 which overlaps with the conductive film 811 with the insulating film 812 interposed therebetween, and conductive films 814 and 815 formed so as to partly overlap with the semiconductor layer 813. The conductive film 811 serves as the gate of the transistor 801. The conductive film 811 and conductive films 816 and 819 can be formed by processing (patterning) a conductive film formed over the insulating surface into desired shapes. One of the conductive films 814 and 815 serves as the source of the transistor 801, and the other of the conductive films 814 and 815 serves as the drain of the transistor 801. The conductive films 814 and 815 and a conductive film 818 can be formed by processing (patterning) a conductive film formed over the insulating film 812 into desired shapes. The insulating film 812 serves as a gate insulating film of the transistor 801.

In addition, the transistor 803 includes the conductive film 816 formed over the insulating surface, the insulating film 812 formed over the conductive film 816, a semiconductor layer 817 which overlaps with the conductive film 816 with the insulating film 812 interposed therebetween, and the conductive films 815 and 818 formed so as to partly overlap with the semiconductor layer 817. The conductive film 816 serves as the gate of the transistor 803. One of the conductive films 815 and 818 serves as the source of the transistor 803, and the other of the conductive films 815 and 818 serves as the drain of the transistor 803. The insulating film 812 serves as a gate insulating film of the transistor 803.

The storage capacitor 804 includes the conductive film 819 formed over the insulating surface, the insulating film 812 formed over the conductive film 819, and the conductive film 818 formed so as to overlap with the conductive film 819 with the insulating film 812 interposed therebetween. The conductive films 819 and 818 serve as the pair of electrodes of the storage capacitor 804. The conductive film 819 is connected to the conductive film 815 through an opening formed in the insulating film 812.

An interlayer insulating film 820 is formed so as to cover the transistors 801 and 803 and the storage capacitor 804.

FIG. 14A and FIG. 15 illustrate an example of the light-emitting transistor 802 having an inverted-staggered structure illustrated in FIG. 12B, and the light-emitting transistor 802 includes a conductive film 821 formed over the interlayer insulating film 820, an insulating film 822 formed over the conductive film 821, conductive films 823 and 824 formed so as to partly overlap with the conductive film 821 with the insulating film 822 interposed therebetween, and a semiconductor layer 825 formed so as to overlap with the conductive film 821 with the insulating film 822 interposed therebetween. The semiconductor layer 825 is connected to the conductive films 823 and 824. The conductive film 821 serves as the gate of the light-emitting transistor 802. One of the conductive films 823 and 824 serves as a source of the light-emitting transistor 802 and the other of the conductive films 823 and 824 serves as a drain of the light-emitting transistor 803. The insulating film 822 serves as a gate insulating film of the light-emitting transistor 802.

The conductive film 821 is connected to the conductive film 815 through an opening formed in the interlayer insulating film 820. The conductive film 823 is connected to the conductive film 818 through an opening formed in the insulating film 822 and the interlayer insulating film 820.

The conductive film 811 serves as the first scan line Gaj, and the conductive film 816 serves as the second scan line Gbj. The conductive film 814 serves as the signal line Si, and the conductive film 818 serves as a wiring for supplying the common potential to the light-emitting transistor 802. The conductive film 824 serves as a power supply line Vi.

This embodiment can be implemented in combination with any of the above embodiment modes and embodiment as appropriate.

Embodiment 3

In this embodiment, a mode of the light-emitting device of the present invention will be described.

Figure 16A:
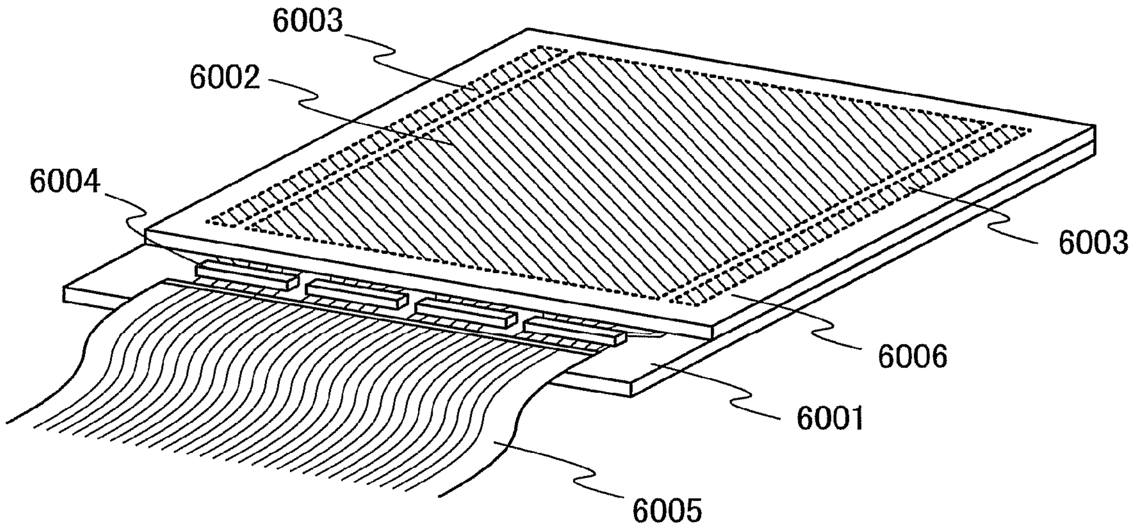
FIGS. 16A and 16B are perspective views each illustrating a mode of a light-emitting device according to an aspect of the present invention.
Figure 16B:
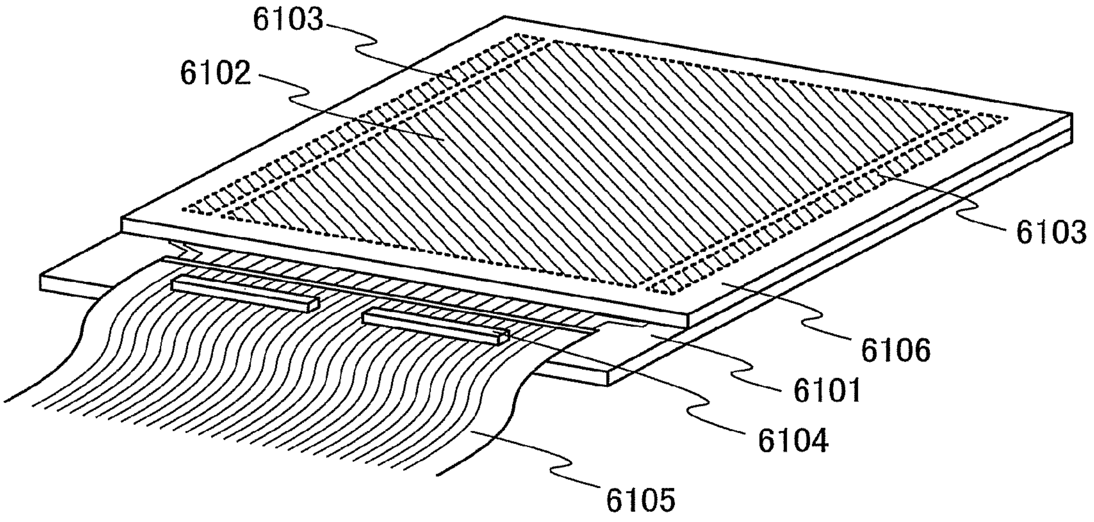

FIGS. 16A and 16B are perspective views each illustrating a light-emitting device obtained by mounting an IC with a chip shape (IC chip) on a panel. In a panel illustrated in FIG. 16A, a pixel portion 6002 and a scan line driver circuit 6003 are formed between a substrate 6001 and a substrate 6006. An IC chip 6004 having a signal line driver circuit is mounted on the substrate 6001. Specifically, the IC chip 6004 having the signal line driver circuit is attached to the substrate 6001 and electrically connected to the pixel portion 6002. Reference numeral 6005 denotes an FPC. Electric power, various signals, and the like are supplied to the pixel portion 6002, the scan line driver circuit 6003, and the signal line driver circuit via the FPC 6005.

In a panel illustrated in FIG. 16B, a pixel portion 6102 and a scan line driver circuit 6103 are formed between a substrate 6101 and a substrate 6106. In addition, an IC chip 6104 having a signal line driver circuit is mounted on an FPC 6105 which is mounted on the substrate 6101. Electric power, various signals, and the like are supplied to the pixel portion 6102, the scan line driver circuit 6103, and the signal line driver circuit via the FPC 6105.

There is no particular limitation on a mounting method of the IC chip, and a known COG method, wire bonding method, TAB method, or the like can be used. Also, a position where the IC chip is mounted is not limited to the positions illustrated in FIGS. 16A and 16B as long as electrical connection is possible. Although FIGS. 16A and 16B each illustrate the example in which the IC chip has only the signal line driver circuit, the IC chip may have the scan line driver circuit. In addition, the IC chip having a controller, a CPU, a memory, or the like may be mounted. Further, the IC chip does not necessarily have an entire signal line driver circuit or scan line driver circuit but the IC chip may have only part of each driver circuit.

Note that, by separately forming and mounting an integrated circuit such as a driver circuit by using an IC chip, the yield can be improved and optimization of a process according to characteristics of each circuit can be easily performed, compared to the case of forming all circuits over the same substrate as the pixel portion.

This embodiment can be implemented in combination with any of the above embodiment modes and embodiments.

Embodiment 4

Figure 17A:
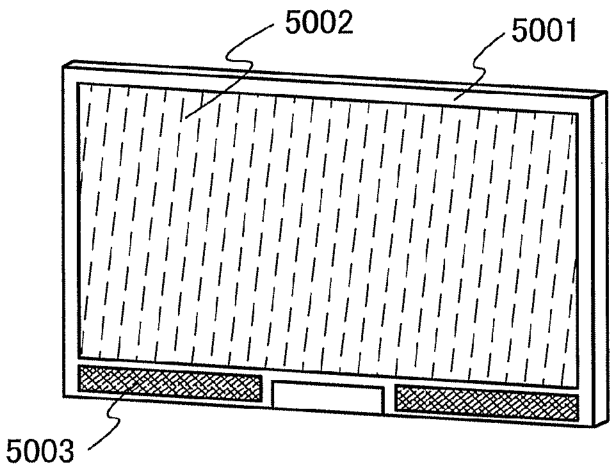
FIGS. 17A to 17C each illustrate an electronic device using a light-emitting device according to an aspect of the present invention.
Figure 17B:
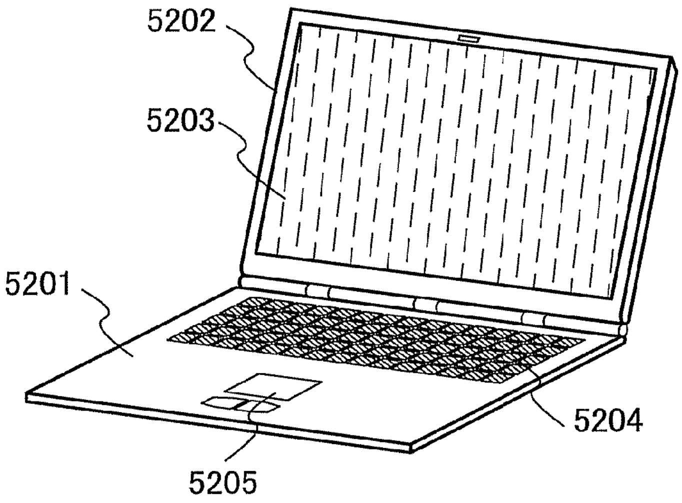
Figure 17C:
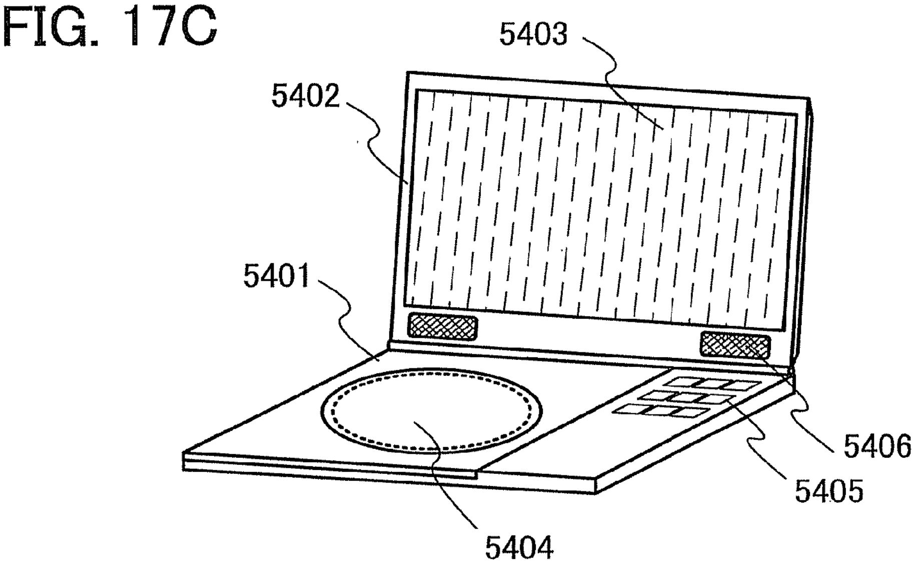

The present invention can provide a light-emitting device which can suppress power consumption and prevent a blur of a moving image. Therefore, the light-emitting device of the present invention is preferably used for display devices, laptop personal computers, or image reproducing devices provided with a recording medium (typically, a device which can reproduce a recording medium such as a DVD (digital versatile disc) and which has a display capable of displaying the image). Further, examples of an electronic device which can use the light-emitting device of the present invention include cellular phones, portable game machines, electronic book readers, cameras such as video cameras and digital still cameras, goggle type displays (head mounted displays), navigation systems, audio reproducing devices (e.g., car audio components and audio components), and the like. FIGS. 17A to 17C illustrate specific examples of these electronic devices.

FIG. 17A illustrates a display device including a housing 5001, a display portion 5002, speaker portions 5003, and the like. The light-emitting device of the present invention can be used for the display portion 5002. Note that the display device includes all display devices for displaying information, for example, for a personal computer, for receiving TV broadcasting, and for displaying an advertisement.

FIG. 17B illustrates a laptop personal computer including a main body 5201, a housing 5202, a display portion 5203, a keyboard 5204, a pointing device 5205, and the like. The light-emitting device of the present invention can be used for the display portion 5203.

FIG. 17C illustrates a potable image reproducing device provided with a recording medium (specifically a DVD player), which includes a main body 5401, a housing 5402, a display portion 5403, a recording medium (DVD or the like) reading portion 5404, operation keys 5405, speaker portions 5406, and the like. The image reproducing device provided with a recording medium includes a home-use game machine and the like. The light-emitting device of the present invention can be used for the display portion 5403.

As described above, the application range of the present invention is very wide and the present invention can be applied to electronic devices in various fields.

This embodiment can be implemented in combination with any of the above embodiment modes and embodiments as appropriate.

This application is based on Japanese Patent Application Serial No. 2008-017188 filed with Japan Patent Office on Jan. 29, 2008, the entire contents of which are hereby incorporated by reference.

What is claimed is:

1. A light-emitting device comprising: a pixel including a light-emitting transistor, a first switching element and a second switching element; wherein the light-emitting transistor, the first switching element, and the second switching element are within the pixel; and wherein the first switching element is configured to control supply of a video signal to a gate of the light-emitting transistor; and wherein the second switching element is configured to control a current flowing between a source and a drain of the light-emitting transistor.

2. The light-emitting device according to claim 1, further comprising a signal line and a power supply line;
- wherein the pixel includes both the signal line and the power supply line;
- wherein the signal line is configured to supply the video signal to the light-emitting transistor through the first switching element; and
- wherein the power supply line is configured to supply the current to the light-emitting transistor.

3. The light-emitting device according to claim 1, further comprising a signal line and a power supply line;
- wherein the pixel includes both the signal line and the power supply line;
- wherein the signal line is electrically connected to the first switching element;
- wherein the first switching element is electrically connected to the gate of the light-emitting transistor;
- wherein the second switching element is electrically connected to one of the source and the drain of the light-emitting transistor; and
- wherein the power supply line is electrically connected to the second switching element or the other of the source and the drain of the light-emitting transistor.

4. A light-emitting device comprising: a pixel including a light-emitting transistor, a first switching element and a second switching element; wherein the light-emitting transistor, the first switching element, and the second switching element are within the pixel; and wherein the first switching element is configured to control supply of a video signal to a gate of the light-emitting transistor; and wherein the second switching element is configured to control electrical connection between the gate and a source of the light-emitting transistor.

5. The light-emitting device according to claim 4, further comprising a signal line and a power supply line;

wherein the pixel includes both the signal line and the power supply line;

wherein the signal line is configured to supply the video signal to the light-emitting transistor through the first switching element; and wherein the power supply line is configured to supply a current to the light-emitting transistor.

6. The light-emitting device according to claim 4, further comprising a signal line and a power supply line;

wherein the pixel includes both the signal line and the power supply line;

wherein the signal line is electrically connected to the first switching element;

wherein the first switching element is electrically connected to the gate of the light-emitting transistor;

wherein the second switching element is electrically connected to the source of the light-emitting transistor; and wherein the power supply line is electrically connected to the second switching element or a drain of the light-emitting transistor.

* * * * *